United States Patent
Yamazaki et al.

(10) Patent No.: US 7,629,025 B2
(45) Date of Patent: Dec. 8, 2009

(54) FILM FORMATION APPARATUS AND FILM FORMATION METHOD

(75) Inventors: Shunpei Yamazaki, Tokyo (JP); Satoshi Seo, Kanagawa (JP); Noriko Shibata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1050 days.

(21) Appl. No.: 10/769,907

(22) Filed: Feb. 3, 2004

(65) Prior Publication Data
US 2004/0154542 A1 Aug. 12, 2004

Related U.S. Application Data

(62) Division of application No. 10/072,310, filed on Feb. 5, 2002, now abandoned.

(30) Foreign Application Priority Data

Feb. 8, 2001 (JP) ............................ 2001-032997

(51) Int. Cl.
*C23C 16/00* (2006.01)
(52) U.S. Cl. .............. 427/248.1; 427/249.14; 427/255.15; 427/255.6
(58) Field of Classification Search .............. 427/248.1, 427/249.14, 255.15, 255.6
See application file for complete search history.

(56) References Cited

U.S. PATENT DOCUMENTS

| | | | |
|---|---|---|---|
| 3,654,525 A | 4/1972 | Maricle et al. | |
| 4,717,585 A * | 1/1988 | Ishihara et al. | 427/568 |
| 5,017,863 A | 5/1991 | Mellitz | |
| 5,039,657 A * | 8/1991 | Goldman et al. | 505/330 |
| 5,170,990 A | 12/1992 | Kamiya et al. | |
| 5,256,945 A | 10/1993 | Imai et al. | |
| 5,271,089 A | 12/1993 | Ozawa | |
| 5,281,489 A | 1/1994 | Mori et al. | |
| 5,486,406 A | 1/1996 | Shi | |
| 5,513,499 A | 5/1996 | deRijkke | |
| 5,719,467 A | 2/1998 | Antoniadis et al. | |
| 5,817,366 A | 10/1998 | Arai et al. | |

(Continued)

FOREIGN PATENT DOCUMENTS

EP 0 817 175 A1 1/1998

(Continued)

OTHER PUBLICATIONS

Australian Patent Office Search Report (SG 200200365-5), Nov. 11, 2003, 11 pages.

(Continued)

*Primary Examiner*—Binh X Tran
(74) *Attorney, Agent, or Firm*—Fish & Richardson P.C.

(57) ABSTRACT

There is provided a film formation apparatus for forming an organic compound film including a plurality of functional regions. A plurality of evaporation sources (203a to 203c) are included in a film formation chamber (210), functional regions made of respective organic compounds are successively formed, and a mixed region can be further formed in an interface between the functional regions. Also, when means for applying energy to an organic compound molecule to be formed into a film in a molecular activation region (213) is provided in such a film formation chamber, a dense film can be formed.

30 Claims, 18 Drawing Sheets

U.S. PATENT DOCUMENTS

| | | | |
|---|---|---|---|
| 5,817,431 A | 10/1998 | Shi et al. | |
| 5,853,847 A | 12/1998 | Takahashi | |
| 5,853,905 A | 12/1998 | So et al. | |
| 5,858,563 A | 1/1999 | Sano et al. | |
| 5,925,472 A | 7/1999 | Hu et al. | |
| 5,925,980 A | 7/1999 | So et al. | |
| 5,955,836 A | 9/1999 | Boerner et al. | |
| 5,989,737 A | 11/1999 | Xie et al. | |
| 6,022,458 A * | 2/2000 | Ichikawa | 204/192.23 |
| 6,030,715 A | 2/2000 | Thompson et al. | |
| 6,042,939 A | 3/2000 | Takahashi | |
| 6,097,147 A | 8/2000 | Baldo et al. | |
| 6,121,727 A | 9/2000 | Kanai et al. | |
| 6,130,001 A | 10/2000 | Shi et al. | |
| 6,132,280 A | 10/2000 | Tanabe et al. | |
| 6,179,923 B1 | 1/2001 | Yamamoto et al. | |
| 6,215,462 B1 | 4/2001 | Yamada et al. | |
| 6,215,806 B1 * | 4/2001 | Ohmi et al. | 372/57 |
| 6,228,228 B1 | 5/2001 | Singii et al. | |
| 6,237,529 B1 | 5/2001 | Spahn | |
| 6,275,649 B1 | 8/2001 | Nagashima et al. | |
| 6,284,050 B1 | 9/2001 | Shi et al. | |
| 6,285,039 B1 | 9/2001 | Kobori et al. | |
| 6,310,360 B1 | 10/2001 | Forrest et al. | |
| 6,326,091 B1 | 12/2001 | Schoo et al. | |
| 6,368,730 B1 | 4/2002 | Kishimoto et al. | |
| 6,372,154 B1 | 4/2002 | Li | |
| 6,392,250 B1 | 5/2002 | Aziz et al. | |
| 6,392,339 B1 | 5/2002 | Aziz et al. | |
| 6,396,209 B1 | 5/2002 | Kido et al. | |
| 6,413,656 B1 | 7/2002 | Thompson et al. | |
| 6,432,255 B1 | 8/2002 | Sun et al. | |
| 6,458,475 B1 | 10/2002 | Adachi et al. | |
| 6,468,676 B1 | 10/2002 | Ueda et al. | |
| 6,495,198 B2 | 12/2002 | Peng | |
| 6,517,996 B1 | 2/2003 | Chao et al. | |
| 6,528,824 B2 | 3/2003 | Yamagata et al. | |
| 6,541,909 B1 | 4/2003 | Motomatsu | |
| 6,558,817 B1 | 5/2003 | Ueda et al. | |
| 6,559,065 B2 | 5/2003 | Kawashima | |
| 6,566,807 B1 | 5/2003 | Fujita et al. | |
| 6,603,140 B2 | 8/2003 | Kobori et al. | |
| 6,614,175 B2 | 9/2003 | Aziz et al. | |
| 6,682,782 B2 | 1/2004 | Jung et al. | |
| 6,759,144 B2 | 7/2004 | Toguchi et al. | |
| 6,774,574 B1 | 8/2004 | Koyama | |
| 6,777,887 B2 | 8/2004 | Koyama | |
| 6,831,406 B1 | 12/2004 | Fukuyama et al. | |
| 2001/0051207 A1 | 12/2001 | Yamagata et al. | |
| 2002/0038867 A1 | 4/2002 | Kobori et al. | |
| 2002/0074935 A1 | 6/2002 | Kwong et al. | |
| 2002/0086180 A1 | 7/2002 | Seo et al. | |
| 2002/0093283 A1 | 7/2002 | Seo et al. | |
| 2002/0101154 A1 | 8/2002 | Seo et al. | |
| 2002/0105005 A1 | 8/2002 | Seo et al. | |
| 2002/0109136 A1 | 8/2002 | Seo et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0118950 A1 | 6/2003 | Chao et al. | |
| 2004/0207331 A1 | 10/2004 | Koyama | |

FOREIGN PATENT DOCUMENTS

| | | |
|---|---|---|
| EP | 1 011 155 | 6/2000 |
| EP | 1 063 630 A2 | 12/2000 |
| EP | 1 065 737 | 1/2001 |
| EP | 1 220 340 | 7/2002 |
| JP | 62-033760 | 2/1987 |
| JP | 03-114197 | 5/1991 |
| JP | 03-162561 | 7/1991 |
| JP | 4-48515 | 2/1992 |
| JP | 04-263453 | 9/1992 |
| JP | 04-357694 | 12/1992 |
| JP | 05-036613 | 2/1993 |
| JP | 08-111285 | 4/1996 |
| JP | 10-233288 | 9/1998 |
| JP | 11-189862 | 7/1999 |
| JP | 11-286771 | 10/1999 |
| JP | 2000-208262 | 7/2000 |
| JP | 2000-277256 | 10/2000 |
| JP | 2000-282219 | 10/2000 |
| JP | 2000-313952 | 11/2000 |
| JP | 2001-5426 | 1/2001 |
| JP | 2001-023776 | 1/2001 |
| JP | 2001-52870 | 2/2001 |
| JP | 2002-151259 | 5/2002 |
| TW | 243470 | 3/1995 |
| TW | 366598 | 8/1999 |
| TW | 451601 | 8/2001 |
| WO | 96/27878 | 9/1996 |
| WO | WO 98/08360 | 2/1998 |
| WO | WO 02/47457 | 6/2002 |

OTHER PUBLICATIONS

Office Action (Korean Application No. 2002-0007323) dated Dec. 14, 2007 with full English translation.

Takeshi Nishi et al., "High Efficiency TFT-OLED Display with Iridium-Complex As Triplet Emissive Center", *Proceedings of the 10th International Workshop on Inorganic and Organic Electroluminescence*, pp. 353-356, Dec. 4-7, 2000.

Kido et al.; "Multilayer white light-emitting organic electroluminescent device"; *Science 267*; pp. 1332-1334; 1995.

Tang et al. "Organic electroluminescent diodes." Applied Physics Letters 51(12): 1987. p. 913-915.

Kijima et al. "A blue organic light emitting diode." Jpn. J. Appl. Phys. vol. 38/Part1 No. 9A: 1999. p. 5274-5277.

C. Adachi et al. "Electroluminescence in organic films with three-layer structure." Jpn. J. Appl. Phys. 27(2): 1988. p. L269-L271.

C.W. Tang et al. "Electroluminescence of doped organic thin films." J. Appl. Phys. 65(9): 1989. p. 3610-3616.

"New Aspect of Research and Development of Organic EL." M&BE Seminar, Bulletin of Organic Molecular/Bioelectronics Subcommittee, Society of Applied Physics, 11(1): 2000. p. 3-12.

T. Wakimoto et al. "Organic EL cells using alkaline metal compounds as electron injection materials." IEEE Transactions on Electron Devices 44(8): 1997. p. 1245-1248.

S.A. Van Slyke et al. "Organic electroluminescent devices with improved stability." Appl. Phys. Lett. 69(15): 1996. p. 2160-2162.

D.F. O'Brien et al. "Improved energy transfer in electrophosphorescent devices." Appl. Phys. Lett. 74(3): 1999. p. 442-444.

T. Tsutsui et al. "High quantum efficiency in organic light-emitting devices with iridium-complex as a triplet emissive center." Jpn. J. Appl. Phys. vol. 38/Part2 No. 12B: 1999. p. L1502-L1504.

T. Tsutsui et al. "The operation mechanism and the light emission efficiency of the organic EL element." Text of the Third Lecture Meeting, Bulletin of Organic Molecular/Bioelectronics Subcommittee, Society of Applied Physics, p. 31-37.

* cited by examiner

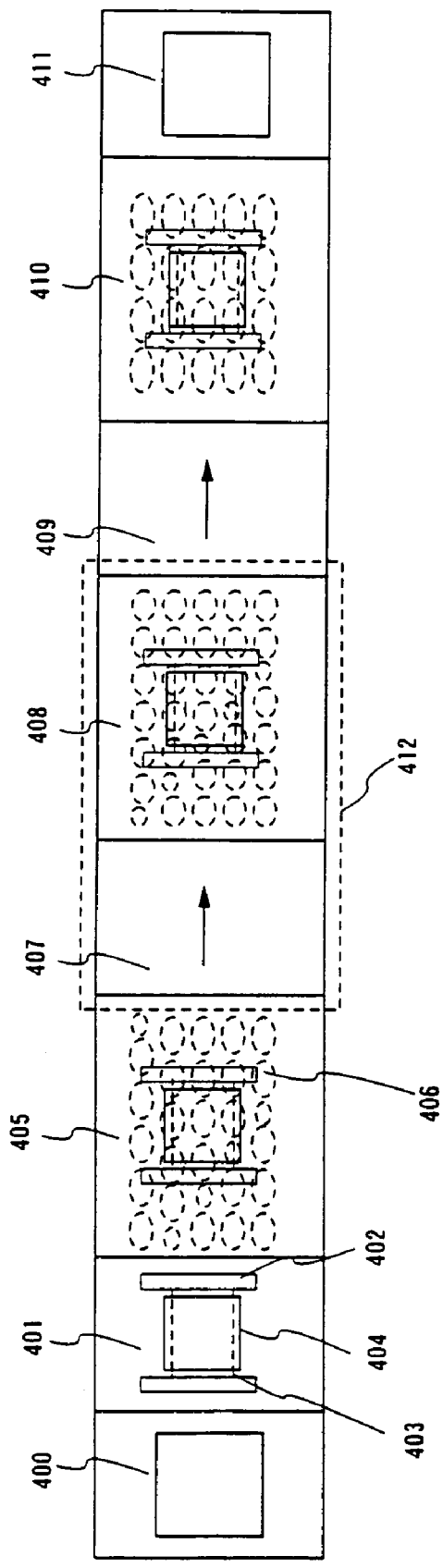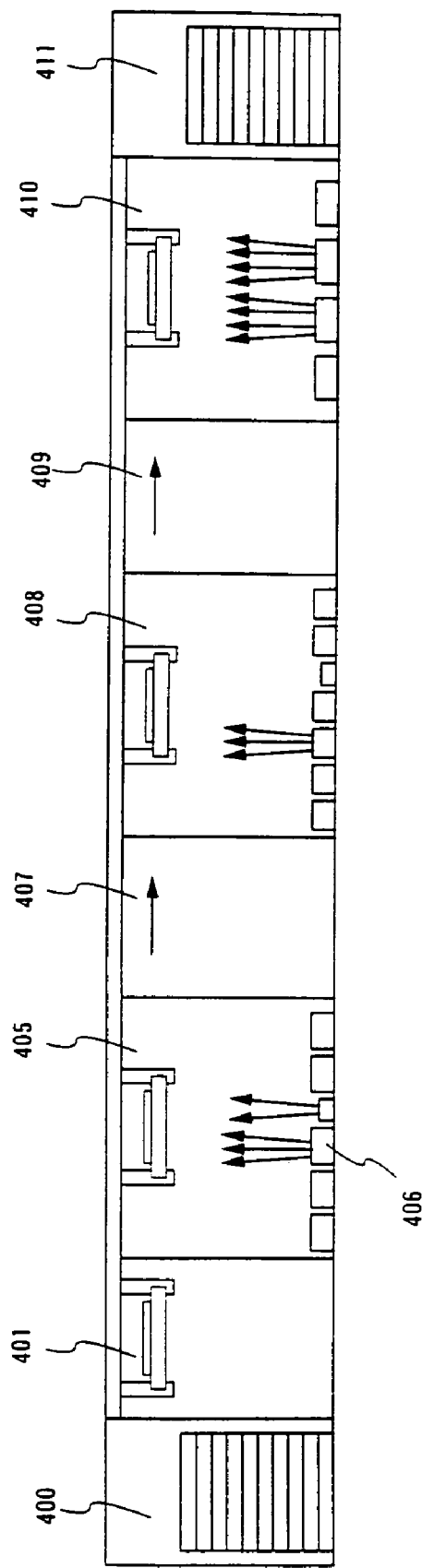

Fig.8A
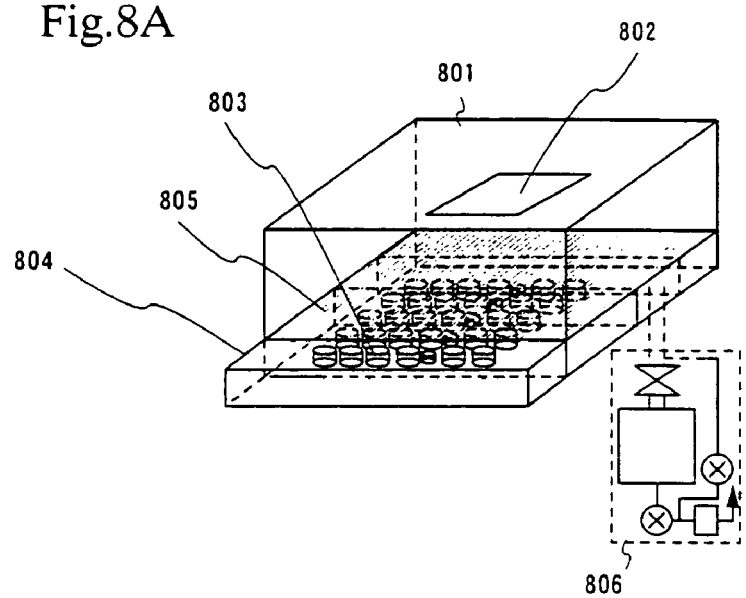
Fig.8B
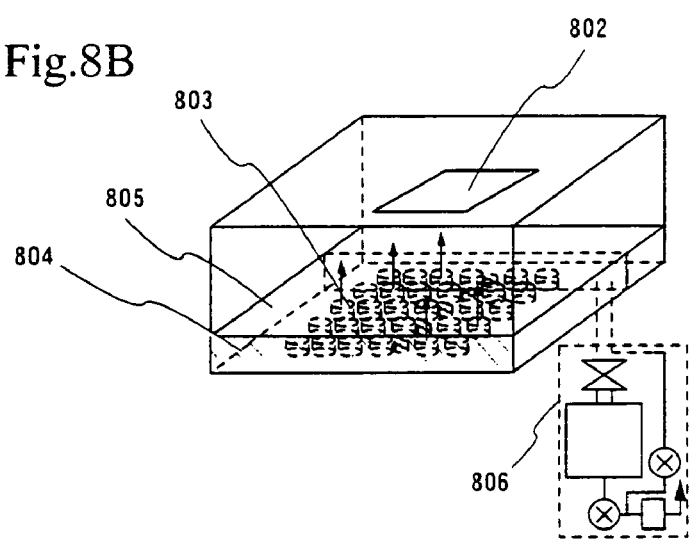
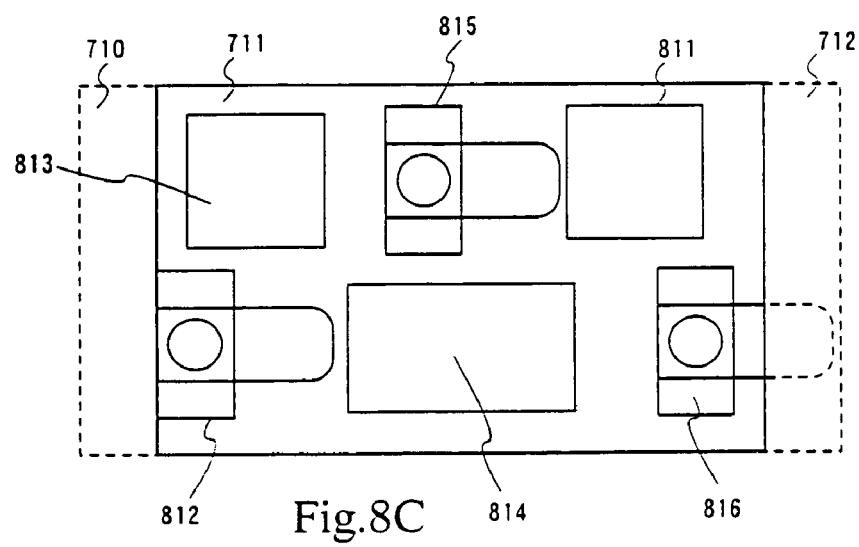
Fig.8C

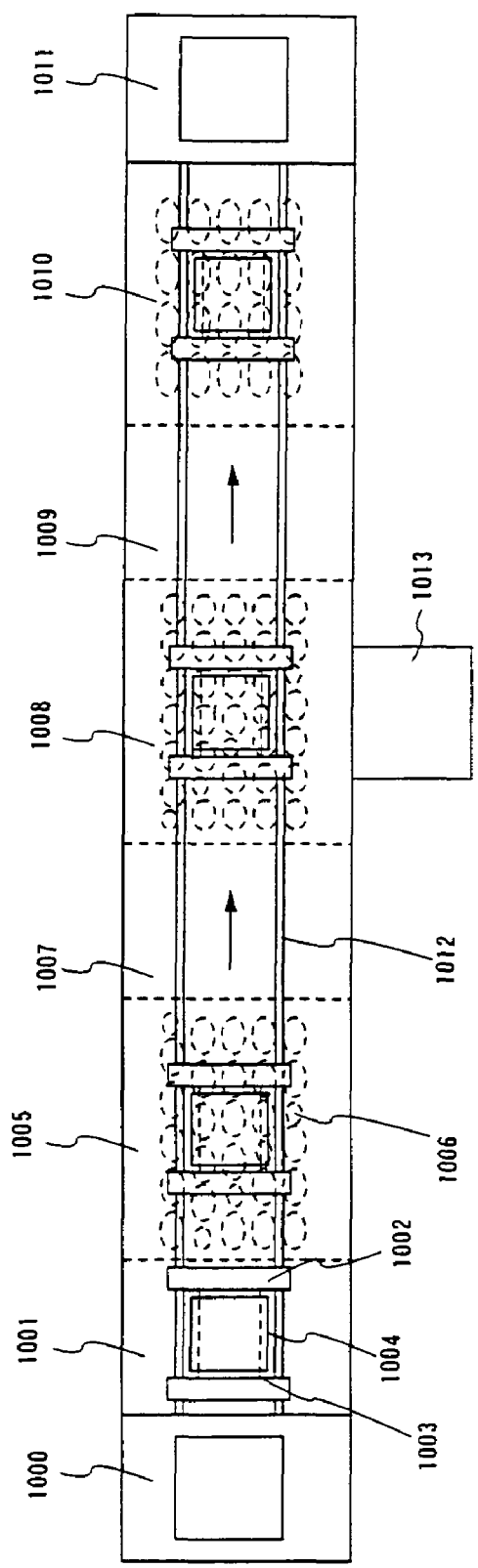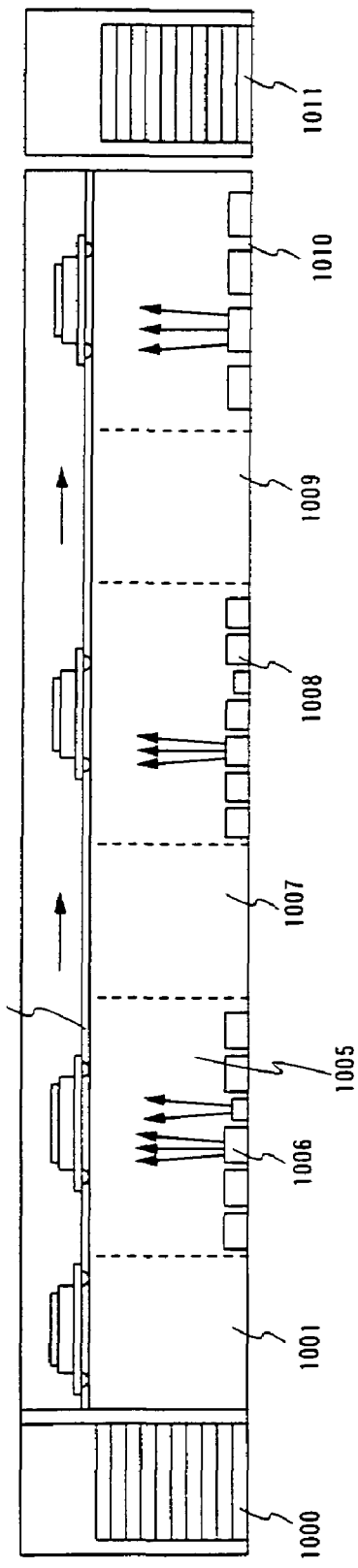

FILM FORMATION APPARATUS AND FILM FORMATION METHOD

CROSS-REFERENCE TO RELATED APPLICATIONS

This application is a divisional application of U.S. application Ser. No. 10/072,310, filed on Feb. 5, 2002, now abandoned which claims the benefit of a foreign priority application filed in Japan on Feb. 8, 2001, as Application No. 2001-032997. This application claims priority to the above-identified prior applications, and the disclosures of the prior applications are considered part of (and are incorporated by reference in) the disclosure of this application.

BACKGROUND OF THE INVENTION

1. Field of the Invention

The present invention relates to a deposition device and a deposition method forming a light emitting element with a film containing an organic compound that emits light upon application of electric field (hereinafter referred to as organic compound layer), as well as an anode and a cathode. Specifically, the present invention relates to a manufacturing of a light emitting element of lower drive voltage than before and of longer lifetime. The term light emitting device in this specification refers to an image display device or a light emitting device that employs as an element a light emitting element. Also included in the definition of the light emitting device are a module in which a connector, such as an anisotropic conductive film (FPC: flexible printed circuit), a TAB (tape automated bonding) tape, or a TCP (tape carrier package), is attached to a light emitting element, a module in which a printed wiring board is provided on the tip of a TAB tape or a TCP, and a module in which an IC (integrated circuit) is mounted directly to a light emitting element by the COG (chip on glass) method.

2. Description of the Related Art

A light emitting element is an element that emits light when electric field is applied. Light emission mechanism thereof is said to be as follows. A voltage is applied to an organic compound film sandwiched between electrodes to cause form the molecular exciton by recombination of electrons injected from the cathode and holes injected from the anode at the luminescent center in the organic compound layer and, when resultant molecular exciton returns to base state, it releases energy in the form of light emission.

There are two types of molecular excitons from organic compounds; one is singlet exciton and the other is triplet exciton. This specification includes both cases where singlet excitation causes light emission and where triplet excitation causes light emission.

In a light emitting element as above, its organic compound film is usually a thin film having a thickness of less than 1 μm. In addition, the light emitting element does not need back light used in conventional liquid crystal displays because it is a self-luminous element and the organic compound film itself emits light. The light emitting element is therefore useful in manufacturing a very thin and light-weight device, which is a great advantage.

When the organic compound film is about 100 to 200 nm in thickness, for example, recombination takes place within several tens nanoseconds since carriers are injected based on the mobility of the carriers in the organic compound film. Even the process from carrier recombination to light emission is taking into account, the organic light emitting element may be ready for light emission within an order of microsecond. Accordingly, fast response is also one of the features of the light emitting element.

Since the light emitting element is of carrier injection type, it can be driven with direct-current voltage and noise is hardly generated. Regarding drive voltage, a report says that a sufficient luminance of 100 cd/m$^2$ is obtained at 5.5 V by using a very thin film with a uniform thickness of about 100 nm for the organic compound film, choosing an electrode material capable of lowering a carrier injection barrier against the organic compound film, and introducing the hetero structure (two-layer structure) (Reference 1: C. W. Tang and S. A. VanSlyke. "Organic electroluminescent diodes", Applied Physics Letters, vol. 51, no. 12, 9)13-915 (1987)).

With those features, including thin/light-weight, fast response, and direct low voltage driving, light emitting elements are attracting attention as next-generation fiat panel display elements. In addition, for their being self-luminous and wide viewing angle, light emitting elements have better visibility and are considered as effective when used for display screens of electric appliances.

In the light emitting element disclosed in Reference 1, the carrier injection barrier is lowered by using a Mg:Ag alloy that is low in work function and is relatively stable for the cathode so that more electrons are injected. This makes it possible to inject a large number of carriers into the organic compound film.

Further, a single hetero structure, in which a hole transporting layer formed of diamine compound and an electron transporting light emitting layer formed of tris(8-quinolinolate) aluminum complex (hereinafter referred to as Alq$_3$) are layered as the organic compound film, is adopted to improve the carrier recombination efficiency exponentially. This is explained as follows.

In the case of a light emitting element whose organic compound film consists of a single layer of Alq$_3$, for example, most of electrons injected from the cathode reach the anode without being recombined with holes and the light emission efficiency is very low. In short, a material that can transport electrons and holes both in balanced amounts (hereinafter referred to as bipolar material) has to be used in order that a single layer light emitting element can emit light efficiently (i.e., in order to drive at low voltage), and Alq$_3$ does not meet the requirement.

On the other hand, when the single hetero structure as the one in Reference 1 is adopted, electrons injected from the cathode are blocked at the interface between the hole transporting layer and the electron transporting light emitting layer and trapped in the electron transporting light emitting layer. Recombination of the carriers thus takes place in the electron transporting light emitting layer with high efficiency, resulting in efficient light emission.

Expanding this idea of carrier blocking function, it is possible to control the carrier recombination region. To give an example, there is a report of success in making a hole transporting layer to emit light by inserting a layer that can block holes (hole blocking layer) between the hole transporting layer and an electron transporting layer and trapping the holes in the hole transporting layer. (Reference 2: Yasunori KIJIMA. Nobutoshi ASAI and Shin-ichiro TAMURA, "A Blue Organic Light Emitting Diode", Japanese Journal of Applied Physics, vol. 38. 5274-5277 (1999)).

It can be said that the light emitting element in Reference 1 is characterized by separation of functions of the hole transporting layer and the electron transporting light emitting layer in which the former layer is assigned to transport holes and the latter layer is assigned to transport electrons and emit light. The idea of separating functions has been expanded to a double hetero structure (three-layer structure) in which a light emitting layer is sandwiched between a hole transporting layer and an electron transporting. (Reference 3: Chihaya ADACHI, Shizuo TOKITO. Tetsuo TSUTSUI and Shogo SAITO, "Electroluminescence in Organic Films with Three-layered Structure", Japanese Journal of Applied Physics, Vol. 27, No. 2' L-69-L271 (1988)).

An advantage of this separation of functions is an increased degree of freedom in molecule design and the like, for the separation of functions saves one organic material from bearing various functions (such as light emission, carrier transportation, and injection of carriers from electrodes) simultaneously (for instance, the separation of functions makes the effort to find a bipolar material unnecessary). In other words, high light emission efficiency can easily be obtained by simply combining a material excellent in light emission characteristic with a material excellent in carrier transportation ability.

Because of these advantages, the idea itself of laminate structure described in Reference 1 (carrier blocking function or separation of functions) continues to be utilized widely.

Also, in the case of manufacturing these light emitting elements, in particular, in the case of a mass production process, when a hole transport material, a light emitting layer material, an electron transport material, and the like are laminated by vacuum evaporation, an in-line system (multi-chamber system) film formation apparatus is used so as not to contaminate respective materials. Note that FIG. 15 is a top view of the film formation apparatus.

According to the film formation apparatus shown in FIG. 15, formation of a three layers structure (double heterostructure) of a hole transport layer, a light emitting layer, and an electron transport layer, vapor-deposition of a cathode, and sealing processing may be performed on a substrate having an anode (such as ITO).

First, the substrate having the anode is loaded to a loading chamber. The substrate is transferred to an ultraviolet ray irradiation chamber via a first transferring chamber and ultraviolet irradiation is performed in a vacuum atmosphere to clean the surface of the anode. Note that, when the anode is an oxide such as ITO, oxidation processing is performed in a pretreatment chamber.

Next, a hole transport layer is formed in an evaporation chamber 1501, light emitting layers (three colors of red, green, and blue in FIG. 15) are formed in evaporation chambers 1502 to 1504, an electron transport layer is formed in an evaporation chamber 1505, and a cathode is formed in an evaporation chamber 1506. Finally, sealing processing is performed in a sealing chamber and a light emitting element is obtained from an unloading chamber.

A feature of such an in-line system film formation apparatus is to perform evaporations of respective layers in different evaporation chambers 1501 to 1505. Therefore, in general, it is sufficient to provide one evaporation source (1511 to 1515) in each of the evaporation chambers 1501 to 1505. Note that, when the light emitting layers are formed in the evaporation chambers 1502 to 1504 by pigment doping, there is a case where two evaporation sources are required to form an coevaporation layer. In other words, the apparatus is constructed such that almost no mixing of respective layer materials with one another will occur.

A structure of a light emitting element manufactured using the film formation apparatus described in FIG. 15 is shown in FIGS. 16A and 16B. In FIGS. 16A and 16B, an organic compound layer 1604 is formed between an anode 1602 and a cathode 1603, which are formed on a substrate 1601. Here, with respect to the formed organic compound layer 1604, different organic compounds are formed in different evaporation chambers. Thus, laminate interfaces between a first organic compound layer 1605, a second organic compound layer 1606, and a third organic compound layer 1607 thus formed are clearly separated.

Now, a region 1608 near an interface between the first organic compound layer 1605 and the second organic compound layer 1606 is shown in FIG. 16B. From this drawing, it is apparent that impurities 1610 are mixed into an interface 1609 between the first organic compound layer 1605 and the second organic compound layer 1606. In other words, in the case of a conventional film formation apparatus shown in FIG. 15, the respective layers are formed in separate film formation chambers. Therefore, when the substrate is moved between the film formation chambers, the impurities 1610 are adhered onto the surface of the substrate and thus mixed into the interface 1609. Note that the impurities as described here specifically refer to oxygen, water, and the like.

Since the laminate structure described above is formed by a junction among different types of materials, an energy barrier is necessarily generated in the interface. If the energy barrier exists, movement of a carrier in the interface is hindered and thus the following problems result.

First, one problem is that the energy barrier becomes a hindrance to a further reduction in a drive voltage. Actually, it is reported that, in terms of a drive voltage of a current light emitting element, an element having a single layer structure using a conjugate polymer is superior and it attains top data (note that comparison for light emission from a singlet excitation state is performed) in power efficiency (unit: [lm/W]) (Reference 4: Tetsuo Tsutsui. "The Japan Society of Applied Physics, Organic Molecule and Bioelectronics Division", Vol. 11, No. 1, P. 8 (2000)).

Note that the conjugate polymer described in reference 4 is a bipolar material and a level equal to that attained in the laminate structure can be achieved with respect to recombination efficiency of a carrier. Thus, as far as equal recombination efficiency of the carrier can be attained without using a laminate structure, by using a bipolar material or the like, actually lower drive voltage is attained with the single layer structure having fewer interfaces.

There is a method of inserting a material for relaxing the energy barrier in an interface with, for example, an electrode to thereby improve injection efficiency of the carrier and thus reduce the drive voltage. (Reference 5: Takeo Wakimoto, Yoshinori Fukuda, Kenichi Nagayama. Akira Yokoi, Hitoshi Nakada, and Masami Tsuchida, "Organic EL Cells Using Alkaline Metal Compounds as Electron Injection Materials", IEEE TRANSACTIONS ON ELECTRON DEVICES, VOL. 44. NO. 8, 1245-1248 (1997)) In Reference 5, Li2O is used for the electron injection layer to achieve the reduction in the drive voltage.

However, the mobility of the carrier in an interface between organic materials (for example, an interface between the hole transport layer and the light emitting layer, and hereinafter referred to as an organic interface) is still an unresolved issue, which is considered as important in attaining a low drive voltage achieved in the single layer structure.

Further, the influence on the element life of the light emitting element is considered as a problem resulting from the energy barrier. That is, there is a reduction in luminance due to storage of a charge resulting from hindered carrier mobility.

A clear theory with respect to this deterioration mechanism is not yet established. However, there is a report that, by inserting the hole injection layer between the anode and the hole transport layer and by performing ac drive by rectangular waves instead of dc drive, the reduction in the luminance can be suppressed. (Reference 6: S. A. VanSlyke. C. H. Chen, and C. W. Tang, "Organic electroluminescent devices with improved stability", Applied Physics Letters. Vol. 69. No. 15, 2160-2162 (1996)) It is said that this is an experimental support such as the storage of a charge is prevented by the insertion of the hole injection layer and the ac drive and thus the reduction in the luminance can be suppressed.

Thus, with respect to the laminate structure, it has an advantage of easily improving recombination efficiency of a carrier and of extending the range of choice of materials in view of functional separation. On the other hand, since a large number of organic interfaces are produced, mobility of the carrier is hindered, which negatively affects the reduction in the drive voltage and the luminance.

Also, in the case of a conventional film formation apparatus, when the hole transport material, the light emitting layer material, the electron transport material, and the like are laminated by vacuum evaporation, evaporation sources are separately provided in separate chambers so as not to contaminate respective materials and different layers are separately formed in different chambers. However, in the case of such an apparatus, when forming the above laminate structure, there is a problem in that not only the organic interfaces are clearly distinguished but also that an impurity such as water or oxygen is mixed into the organic interfaces when the substrate is moved between the chambers.

SUMMARY OF THE INVENTION

Therefore, an object of the present invention is to provide a film formation apparatus for relaxing the energy barrier existing in the organic compound film to improve the mobility of the carrier and also for manufacturing an element which has various kinds of functions of plural materials as functional separation of the laminate structure, based on a concept different from a conventional laminate structure. Also, an object of the present invention is to provide a film formation method using the film formation apparatus. Further, an object of the present invention is to provide a film formation apparatus capable of forming a denser film in order to improve a characteristic of an organic compound film formed for the improvement of an element characteristic and extension of an element life.

The relaxation of the energy barrier in the laminate structure is observed notably in the technique for the insertion of a carrier injection layer as described in Reference 5. In other words, when a material for relaxing an energy barrier is inserted to the interface of a laminate structure with a large energy barrier, the energy barrier can be designed as being step-shaped.

Thus, injection efficiency of carriers from an electrode can be improved and a drive voltage can be reduced to some extent. However, a problem is that the number of organic interfaces is increased with the increase in the number of layers. This is considered as the reason why a single layer structure attains top data in terms of the drive voltage and the power efficiency, as described in Reference 4.

On the other hand, if the above problem is overcome, advantages of the laminate structure (i.e. various materials can be combined and a complicated molecular design is not required) may be maintained while the drive voltage and power efficiency of the single layer structure is attained at the same time.

Thus, according to the present invention, an organic compound film 104 including a plurality of functional regions is formed between an anode 102 and a cathode 103 of a light emitting element as shown in FIG. 1A. In this case, a structure., in which a first mixed region 108 is formed between a first functional region 105 and a second functional region 106, is obtained. The first mixed region 107 is formed of both a material composing the first functional region 105 and a material composing the second functional region 106.

Further, a structure, in which a second mixed region 109 is formed between the second functional region 106 and a third functional region 107. The second mixed region 108 is formed of both the material composing the second functional region 106 and a material composing the third functional region 107.

When the structure as shown in FIG. 1A is applied, it is considered that the energy barriers existing between the functional regions are relaxed and the injection efficiency of the carrier is improved. Therefore, the reduction in the drive voltage becomes possible and the deterioration in the luminance can be prevented.

Thus, a film formation apparatus according to the present invention is characterized in that, in the case where a light emitting element including a region where a first organic compound can exhibit a function (a first functional region) and a region where a second organic compound different from a material composing the first functional region can exhibit a function (a second functional region) and a light emitting device which has such a light emitting element are manufactured, a mixed region made of an organic compound composing the first functional region and an organic compound composing the second functional region is formed between the first functional region and the second functional region.

Also, the first mixed region 107 formed between the first functional region 105 and the second functional region 106 as shown in FIG. 1A is successively formed in the same film formation chamber, as shown in FIG. 1B. Thus, mixing of impurities shown in FIG. 16B can be also prevented.

Note that the first organic compound and the second organic compound respectively have a property selected from the group consisting of a hole injection property of receiving a hole from the anode, a hole transport property that hole mobility is larger than electron mobility, an electron transport property that electron mobility is larger than hole mobility, all electron injection property of receiving an electron from the cathode, a blocking property of blocking mobility of a hole or an electron, and a light emitting property of producing light emission. The property of the first organic compound is different from that of the second organic compound.

Note that a phthalocyanine system compound is preferable as an organic compound with a high hole injection property, an aromatic diamine compound is preferable as an organic compound with a high hole transport property, and a metallic complex including quinoline skeleton, a metallic complex including benzoquinoline skeleton, an oxadiazole derivative, a triazole derivative, or a phenanthroline derivative is preferable as an organic compound with a high electron transport property. Further, a metallic complex including quinoline skeleton which produces stable light emission, a metallic complex including benzoxazole skeleton, or a metallic complex including benzothiazole skeleton is preferable as an organic compound which has a light emitting property and produces stable light emission.

Combinations of the first functional region and the second functional region as described above are shown in Table 1. With respect to combinations A to E, a combination may be introduced alone (for example, only combination A is introduced) or plural combinations ma be combined and introduced (for example, both combinations A and B).

TABLE 1

| combination | 1st functional region | 2nd functional region |
| --- | --- | --- |
| A | hole injection property | hole transport property |
| B | electron injection property | electron transport property |
| C | hole transport property | light emitting property |
| D | electron transport property | light emitting property |
| E | electron transport property | blocking property |

Also, when the combinations C and D are combined and introduced (that is, when mixed regions are introduced to both interfaces of the functional region with a light emitting property), diffusion of a molecular exciton produced in the light emitting region is prevented and thus light emitting efficiency can be further improved. Therefore, excitation energy in the light emitting region is preferably lower than excitation energy in each of a hole transport region and excitation energy in the electron transport region. In this case, a light emitting material with a poor carrier transport property can be also utilized for the light emitting region. Thus, there is an advantage that the range for choosing materials is extended. Note that excitation energy as described herein indicates an energy difference between a highest occupied molecular orbital (HOMO) and a lowest unoccupied molecular orbital (LUMO) in a molecule.

More preferably, the light emitting region is made of a host material and a light emitting material (dopant) which has lower excitation energy than the host material, and excitation energy of the dopant is made lower than the excitation energy in a hole transport region and the excitation energy in the electron transport region. Thus, the diffusion of a molecular exciton of the dopant can be prevented and light emission of the dopant can be effectively produced. Further, when the dopant is a carrier trap type material, the recombination efficiency of the carrier can be also improved.

According to the film formation apparatus of the present invention, a light emitting element which has a structure as shown in FIG. 1C can also be manufactured. As shown in FIG. 1C, with respect to an organic compound film 104 formed between the anode 102 and the cathode 103 on the substrate 101, a structure in which a first mixed region 112 is formed between a first functional region 110 of a first organic compound and a second functional region 111 of a second organic compound. The first mixed region 112 is made of both a material composing the first functional region 110 and a material composing the second functional region 111. When the entire or a part of the first mixed region is doped with a third organic compound, a third functional region 113 can be formed in the entire or a part of the first mixed region. Note that the third functional region 113 formed here becomes a region for producing light emission.

Note that, in forming the element structure shown in FIG. 1C, the first organic compound and the second organic compound are made from an organic compound with a property selected from the group consisting of a hole injection property, a hole transport property an electron transport property, an electron injection property, and a blocking property. The respective organic compounds composing the first organic compound and the second organic compound have different properties. It is also required that the third organic compound is an organic compound (dopant) with a light emitting property and a material with lower excitation energy than each of the first organic compound and the second organic compound is used there for. In the third functional region 113, the first organic compound and the second organic compound serve as hosts to the dopant.

Recently, in view of light emitting efficiency, an organic light emitting element, which is capable of converting energy produced in returning from a triplet excitation state to a ground state (hereinafter referred to as triplet excitation energy) into light to be emitted, is noted because of its high light emitting efficiency. (Reference 7: D. F. O'Brien, M. A. Baldo, M. E. Thompson and S. R. Forrest, "Improved energy transfer in electrophosphorescent devices". Applied Physics Letters, vol. 74, No. 3, 442-444 (1999)) (Reference 8: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency in Organic Light-Emitting Devices with Iridium-Complex as a Triplet Emissive Center", Japanese Journal of Applied Physics, Vol. 38, L1502-L1504 (1999)).

A metallic complex including platinum as main metal is used in Reference 7 and a metallic complex including iridium as main metal is used in Reference 8. According to such an organic light emitting element capable of converting the triplet excitation energy into light to be emitted (hereinafter referred to as a triplet light emitting element), light emission at higher luminance and higher light emitting efficiency can be achieved as compared with a conventional element.

However, according to a report in Reference 8, the luminance halves in about 170 hours in the case where an initial luminance is set to be 500 $cd/m^2$ and thus there is a problem regarding, an element life. Therefore, when the present invention is applied to the triplet light emitting element, it is possible to obtain a light emitting element with a very high performance such as a long element life, in addition to high luminance light emission and high light emitting efficiency attained, by using light emission from the triplet excitation state.

Thus, the case, where a material capable of converting the triplet excitation energy into light to be emitted is added as a dopant to the first mixed region 112 to form the third functional region 113 in the light emitting element shown in FIG. 1C, is also included in the present invention. Also, when the mixed region is formed, a concentration gradient may be provided in the mixed region.

The film formation apparatus of the present invention is characterized in that a plurality of functional regions are formed and a light emitting element with the mixed region as described above is formed in the same film formation chamber which has a plurality of evaporation sources.

A film formation chamber 210 included in the film formation apparatus of the present invention will be described using FIGS. 2A and 2B. Note that common reference symbols are used for the same portions shown in FIGS. 1A to 1C. As shown in FIG. 2A, metallic masks 202 held in a holder 201 are provided under the substrate 101 and evaporation sources 203 are provided thereunder. The evaporation sources 203 (203a to 203c) are composed of material chambers 205 (205a to 205c) in which organic compounds 204 (204a to 204c) for forming organic compound films are set and shutters 206 (206a to 206c). Note that evaporation sources or a substrate onto which vapor-deposition is to be performed is preferably moved (rotated) so as to form a film at uniform thickness in the film formation apparatus of the present invention.

Also, the material chambers 205 (205a to 205c) are made of conductive metallic materials and has a concrete structure as shown in FIG. 18. When a voltage is applied to these material chambers and the organic compounds 204 (204a to 204c) disposed inside are heated by resistance produced in application of the voltage, the organic compounds are vaporized and vapor-deposited onto the surface of the substrate 101. Note that the "surface of the substrate 101" as described herein includes the substrate and a thin film formed thereon. Here, the anode 102 is formed on the substrate 101.

Vapor-deposition of the vaporized organic compounds 204 (204a to 204c) is controlled by the shutters 206 (206a to 206c). That is, when the shutters are opened, the organic compounds 204 (204a to 204c) vaporized by heating can be vapor-deposited. Thus, in this specification, the state where the shutters are opened and the vapor-deposition of the organic compounds has thus become possible is referred to as "the evaporation sources are operated".

When the organic compounds 204 (204a to 204c) are heated for vaporization before vapor-deposition and thus can be vapor-deposited immediately after the shutters 206 (206a to 206c) are opened at the time of vapor-deposition, a film formation time can be desirably shortened.

According to the film formation apparatus of the present invention, the organic compound film which has the plurality of functional regions is formed in one film formation chamber and the plurality of evaporation sources 203 are provided corresponding to the functional regions. In the present invention, since the plurality of evaporation sources are simultaneously operated, the plurality of organic compounds are simultaneously vapor-deposited. Also, when the plurality of evaporation sources are operated in succession, the plurality of organic compounds can be vapor-deposited in succession. Further, the plurality of evaporation sources can be operated in succession without time interruption. Note that, when the evaporation sources are operated, the organic compounds are vaporized and flown upward, and then vapor-deposited on the substrate 101 through openings 212 provided in the metallic mask 202.

In the film formation chamber of the present invention, exhaust means for evacuating the interior of the film formation chamber are provided. Exhaust pumps are used as the exhaust means and the pressure is reduced thereby. Note that the degree of vacuum to be reached at the time of pressure reduction is desirably $10^{-6}$ Pa or more. For example, a combination out of a dry pump, a mechanical booster pump, a turbo molecular pump (magnetic levitation type), a cryopump, and the like can be used. For example, a cryopump can be used as a first exhaust means 214 and a dry pump can be used as a second exhaust means 215.

According to this embodiment, in addition to the film formation chamber, with respect to respective processing chambers such as a load chamber, an alignment chamber, a sealing chamber, and an unload chamber, a material such as aluminum or stainless (SUS) mirror-finished by electropolishing is used for an inner wall surface in order to reduce the surface area and thus to decrease absorption of an impurity such as oxygen or water. Also, an inner member made of a material such as ceramics, which is processed so as to have extremely few pores, is used. Each of these materials have a surface evenness that the average surface roughness is 5 nm or less (preferably, 3 nm or less). The average surface roughness as described here is a roughness such that a center line average roughness defined by JIS B0601 is three-dimensionally extended so as to be applied to a surface.

A film formation method using the above firm formation apparatus will be described specifically hereinbelow.

First, the first organic compound 204a set in the first material chamber 205a is vapor-deposited. The first organic compound 204a is vaporized in advance by resistance heating. When the shutter 206a is opened at the vapor-deposition, the first organic compound is flown toward the substrate 101. Thus, the first functional region 105 shown in FIG. 1A can be formed.

Then, with a state in which the first organic compound 204a is being vapor-deposited, the shutter 206b is opened and the second organic compound 204b set in the second material chamber 205b is vapor-deposited. The second organic compound is also vaporized in advance by resistance heating. When the shutter 206b is opened for the vapor-deposition, the second organic compound is flown toward the substrate 101. Here, the first mixed region 108 which are made of the first organic compound 204a and the second organic compound 204b can be formed.

Then, after a while, only the shutter 206a is closed and the second organic compound 204b is vapor-deposited. Thus, the second functional region 106 can be formed.

Note that the method of simultaneously vapor-depositing two kinds of organic compounds to form the mixed region is described here. However, when the first organic compound is vapor-deposited and then the second organic compound is vapor-deposited in the same evaporation atmosphere, the mixed region can be also formed between the first functional region and the second functional region.

Next, with a state in which the second organic compound 204b is being vapor-deposited, the shutter 206c are opened and the third organic compound 204c set in the third material chamber 205c is vapor-deposited. The third organic compound 204c is also vaporized in advance by resistance heating. When the shutter 206c is opened for the vapor-deposition, the third organic compound is flown toward the substrate 101. Here, the second mixed region 109 which are made of the second organic compound 204b and the third organic compound 204c can be formed.

Then, after a while, only the shutter 206b is closed and the third organic compound 204c is vapor-deposited. Thus, the third functional region 107 can be formed.

Finally, the cathode 103 is formed, and thus a light emitting element manufactured by the film formation apparatus of the present invention is completed.

The light emitting element shown in FIG. 1C is manufactured as follows by the film formation apparatus of the present invention. The first functional region 110 is formed using the first organic compound 204a and then the first mixed region 112 made of the first organic compound 204a and the second organic compound 204b is formed. During the formation of the first mixed region 112, the shutter 206c is opened temporarily (or for the same time) and vapor-deposition (or doping) of the third organic compound 204c is simultaneously performed to thereby form the third functional region 113.

When the third organic compound is to be doped temporarily, the shutter 206c is closed, and thus the first mixed region 112 is again formed. Also, when the entire first mixed region 112 is doped with the third organic compound, the shutters 206b and 206c are simultaneously closed.

Further, the second functional region 111 is formed of the second organic compound 204b. Thus, the organic compound film 104 is formed. Then, the cathode is formed in another film formation chamber or in another film formation apparatus to thereby manufacture the light emitting element.

Here, the evaporation sources provided in the film formation chamber is shown in FIG. 2B. FIG. 2B shows the arrangement of the evaporation sources provided in the film formation chamber, which is viewed from the top of the film formation chamber.

Now, the case, where the organic compound film is formed using three kinds of organic compounds as shown in FIG. 1A, will be described. The evaporation sources 203a, 203b, and 203c, in which three kinds of organic compounds are respectively set, are arranged laterally in a row. K rows (k=1 to 10) are provided. Thus, when the plurality of evaporation sources each including the same kind of organic compound are provided in the same film formation chamber, a film thickness of the organic compound film formed on the substrate can be made uniform. Note that the case where three kinds of organic compounds are placed in different arrangements between adjacent rows (1) is described here. However, such arrangement need not necessarily be taken and these organic compounds may be arranged in the same order in all of the rows.

Note that the film is formed using the plurality of evaporation sources in the same film formation chamber in the film formation apparatus of the present invention. Thus, in order to improve a film formation characteristic, the function that the evaporation sources including organic materials used for film formation is moved in an optimum position under the substrate at the time of film formation, or the substrate is moved to an optimum position over the evaporation sources, may be provided.

The film formation chamber in the film formation apparatus of the present invention has a mechanism for forming the organic compound film made of the organic compounds to be a denser film.

Specifically, when the organic compounds for forming the organic compound film are heated at the time of film formation in the film formation chamber, they are vaporized by heating and flown onto the substrate by kinetic energy of molecules. Thus, the organic compound film is formed on the substrate. Here, in order to form these organic compounds into a denser film on the substrate, it is necessary to extend the residence time of the organic compounds as molecules on the surface of the substrate.

However, the kinetic energy of molecules applied by heating is decreased with a lapse of time. Thus, it is necessary to apply energy again to gas molecules in a molecular activation region 213 on the surface of the substrate and thus to accelerate the kinetic energy.

Therefore, light sources 211 for irradiating light are provided in the film formation chamber 210 to irradiate the organic compound molecules with light. The organic compounds to which the energy is applied by light irradiation are activated. Note that infrared light, ultraviolet light, or visible light is irradiated from the light sources 211. In view of preventing damage to the organic compound molecules, infrared light is preferable.

The residence time of the organic compound molecules on the surface of the substrate is extended by light irradiation and the organic compound molecules can be easily formed into a film in an optimum position on the substrate. Thus, a denser film can be formed.

FIG. 3A shows a structure of the organic compound film formed by ordinary film formation process and FIG. 3B shows a structure of the organic compound film in the case where the organic compound film is irradiated with light in the molecular activation region 213.

With respect to the respective structures, an anode is formed on a substrate, a first functional region 221, a first mixed region 222, and a second functional region 223 are formed thereon, and finally a cathode is formed thereon. Thus, light emitting elements with such structures are obtained. According to the element shown in FIG. 3B, a distance between the organic compound molecules becomes short and thus a denser film is formed, as compared with the element shown in FIG. 3A. Note that, when gaps are produced between the organic compound molecules in the inner portion of the organic compound film as shown in FIG. 3A, they become defects and movement of carriers is hindered in the defect portions. Thus, the reduction in luminance and the deterioration in an element are caused by the storage of charges. Therefore, it is effective to provide the light sources in the film formation chamber and light irradiation is performed at film formation.

Further, adhesion-preventing shields 207 for preventing the organic compounds from adhering to the inner wall of the film formation chamber at the time of vapor-deposition, are provided in the film formation chamber of the present invention. When the adhesion-resistant shields 207 are provided, the organic compounds which are not vapor-deposited on the substrate can be adhered thereto. Heaters 208 are provided around the adhesion-resistant shields 207 and in contact therewith. The entirety of the adhesion-resistant shield 207 can be heated by the heaters 208. Note that, when the adhesion-preventing shields 207 are heated, the organic compounds adhered thereto can be vaporized. Thus, the interior of the film formation chamber can be cleaned.

According to the film formation apparatus of the present invention capable of forming the above organic compound film, the interface between the functional regions are not contaminated with an impurity and the mixed region can be formed in the interface between the functional regions since the organic compound film including the plurality of functional regions can be formed in the same film formation chamber. Thus, a light emitting element which has a plurality of functions without indicating a clear laminate structure (that is, without including a clear organic interface) can be manufactured.

BRIEF DESCRIPTION OF THE DRAWINGS

In the accompanying drawings:

FIGS. 4A and 4B are explanatory views of the film formation apparatus;

FIGS. 8A to 8C are explanatory views of a material exchange chamber;

FIGS. 10A and 10B are explanatory views of the film formation apparatus;

DETAILED DESCRIPTION OF THE PREFERRED EMBODIMENTS

Figure 1A:
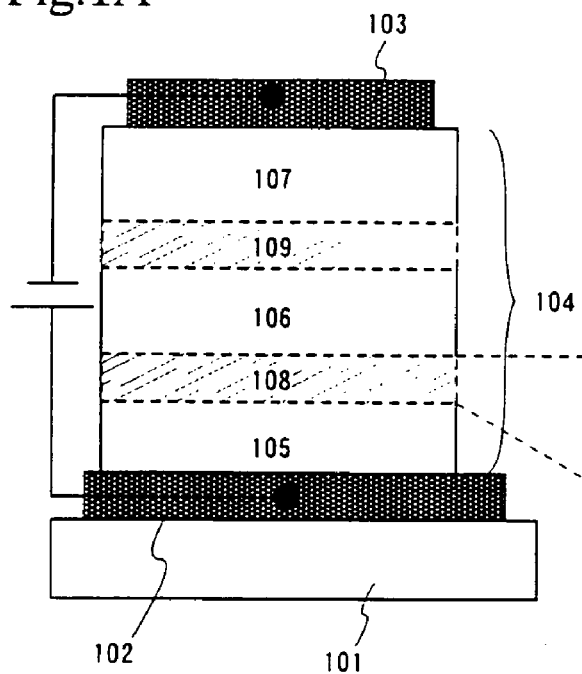
FIGS. 1A to 1C are explanatory views of a structure of an element manufactured by a film formation apparatus of the present invention.
Figure 1B:
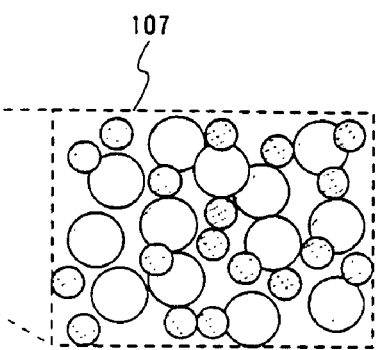
Figure 1C:
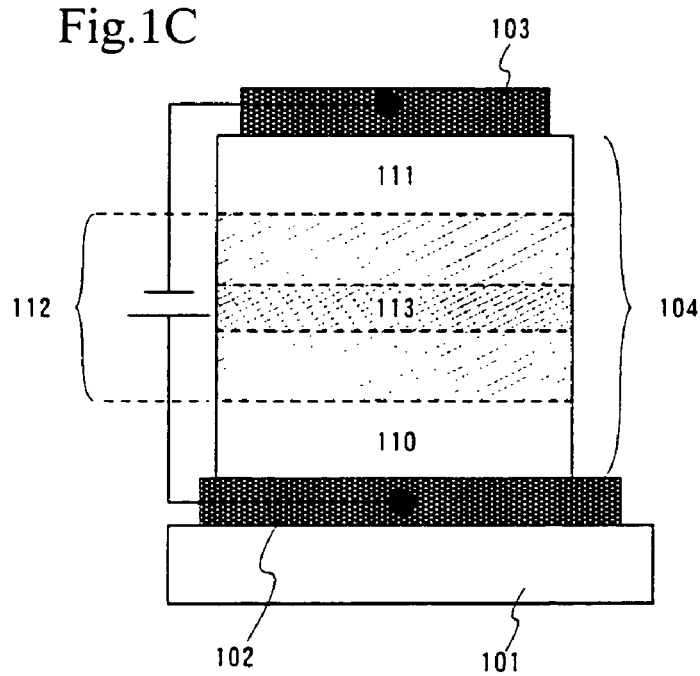

A structure of a film formation apparatus according to the present invention will be described using FIGS. 4A and 4B. FIG. 4A is a top view of the film formation apparatus and FIG. 4B is a cross sectional view thereof. Note that common reference symbols are used for the common portions. Also, an example, in which three kinds of organic compound films (red, green, and blue) are formed in respective film formation chambers of an in-line system film formation apparatus including three film formation chambers, is described in the present embodiment mode.

In FIG. 4A, reference numeral 400 denotes a load chamber. A substrate set in the load chamber 400 is transferred to a first alignment chamber 401. In the first alignment chamber 401, alignment of a metallic mask 403 held in advance in a holder 402 is performed for each holder. A substrate 404 before vapor-deposition is disposed on the metallic mask 403 for which the alignment is completed. Thus, the substrate 404 and the metallic mask 403 are formed integrally and transferred to a first film formation chamber 405.

Now, positional arrangement of the holder 402 for holding the metallic mask 403 and the substrate 404 will be described using FIGS. 5A to 5E. Note that the same reference symbols are used for the same portions as those in FIGS. 4A and 4B.

Figure 5A:
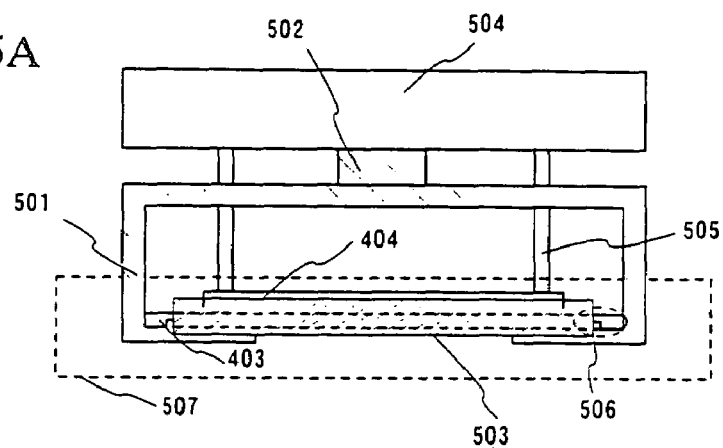
FIGS. 5A to 5E are explanatory views of an alignment method for a metallic mask.

FIG. 5A shows a cross sectional structure. The holder 402) is composed of a mask holder 501, a shaft 502, a substrate holder 503, a control mechanism 504, and auxiliary pins 505. The metallic mask 403 is held corresponding to protrusions 506 on the mask holder 501 and the substrate 404 is located on the metallic mask 403. The substrate 404 on the metallic mask 403 is held by the auxiliary pins 505.

Figure 5B:
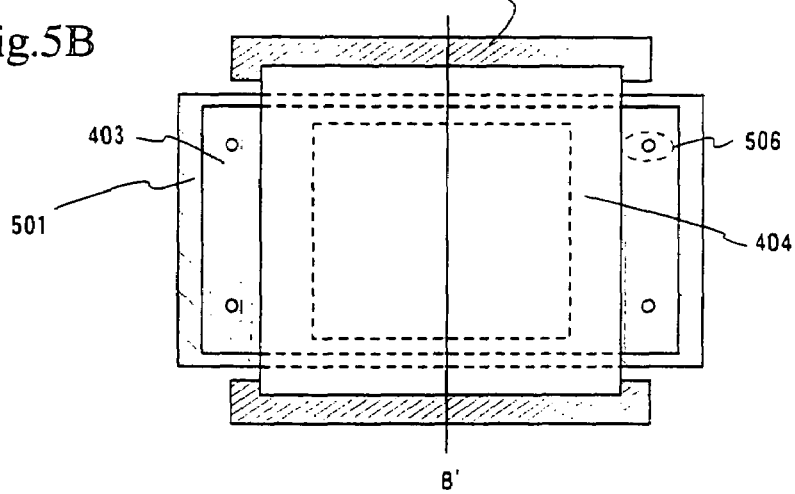

FIG. 5B is a top view of a region 507 in FIG. 5A. The substrate 404 is held in the substrate holder 503 as shown in FIG. 5A or 5B.

Figure 5C:
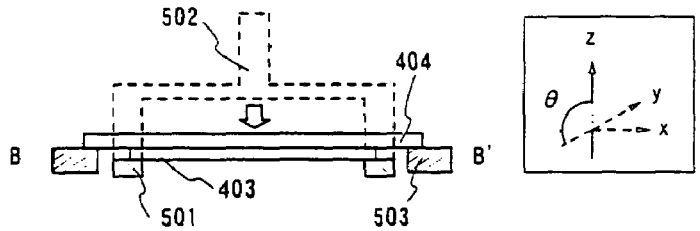

Further, FIG. 5C is a cross sectional view obtained by cutting FIG. 5B along a line B-B'. When it is assumed that the metallic mask 403 is located in the position as shown in FIG. 5C at the time of film formation, the metallic mask 403 is located in the position shown in FIG. 5D at the time of alignment such as obtained by shifting the shaft 502 in a Z-axis direction.

Figure 5D:
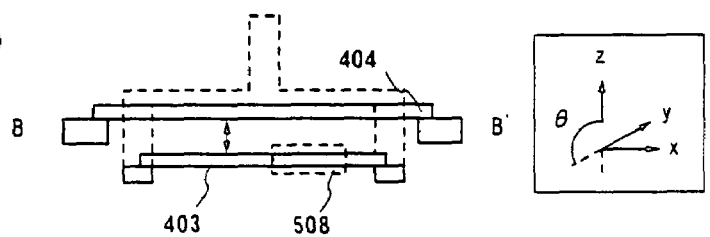

In the state shown in FIG. 5D, the shaft 502 can be shifted in an X-axis, a Y-axis, or a Z-axis direction. Also, inclination (e) of an X-Y plane relative to the Z-axis may be shifted. The control mechanism 504 outputs shift information from position information obtained by a CCD camera and position information which is inputted in advance. Thus, the position of the mask holder can be aligned to a predetermined position through the shaft 502 connected with the control mechanism 504.

Figure 5E:
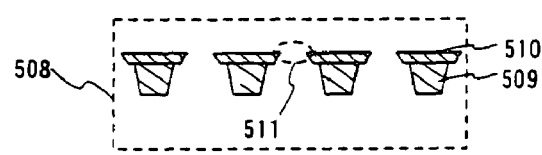

FIG. 5E is an enlarged view of a region 508 in the metallic mask 403. The metallic mask 403 used here is composed of a mask a 509 and a mask b 510, which are made of different materials. At the time of vapor-deposition, the organic compounds passed through openings 511 are formed into films on the substrate. These shapes are devised so as to improve film formation precision in the case of vapor-deposition and the mask b 510 is located at the substrate 404 side.

After the alignment of the metallic mask 403 is completed, the shaft is shifted in a Z-axis direction to again move the metallic mask 403 to the position shown in FIG. 5C and then the metallic mask 403 and the substrate 404 are held by the auxiliary pins 505. Thus, the alignment of the metallic mask 403 and the alignment between the metallic mask 403 and the substrate 404 can be completed.

In the present embodiment mode, openings of the metallic mask 403 may be formed in a square shape, a rectangular shape, a circular shape, or an elliptical shape. These openings may be arranged in a matrix or a delta. In addition, the openings may be formed in a line.

In FIG. 4A, a plurality of evaporation sources 406 are provided in the first film formation chamber 405. Each of the respective evaporation sources 406 is composed of a material chamber (not shown) including an organic compound and a shutter (not shown) which is opened and closed to control flying of the organic compound vaporized in the material chamber to the outside of the material chamber.

The organic compounds which compose the organic compound film of the light emitting element and have a plurality of different functions are set in the plurality of evaporation sources 406 included in the first film formation chamber 405. Note that the organic compounds as described here have a property selected from the group consisting of a hole injection property of receiving a hole from the anode, a hole transport property that hole mobility is larger than electron mobility, an electron transport property that electron mobility is larder than hole mobility, an electron injection property of receiving an electron from the cathode, a blocking property of blocking transfer of a hole or an electron, and a light emitting property of producing light emission.

Note that a phthalocyanine system compound is preferable as an organic compound with a high hole injection property, an aromatic diamine compound is preferable as an organic compound with a high hole transport property, and a metallic complex including benzoquinoline skeleton, an oxadiazole derivative, a triazole derivative, or a phenanthroline derivative is preferable as an organic compound with a high electron transport property. Further, a metallic complex including quinoline skeleton, a metallic complex including benzoxazole skeleton, or a metallic, complex including benzothiazole skeleton, which produces stable light emission, is preferable as an organic compound with a light emitting property.

Figure 2A:
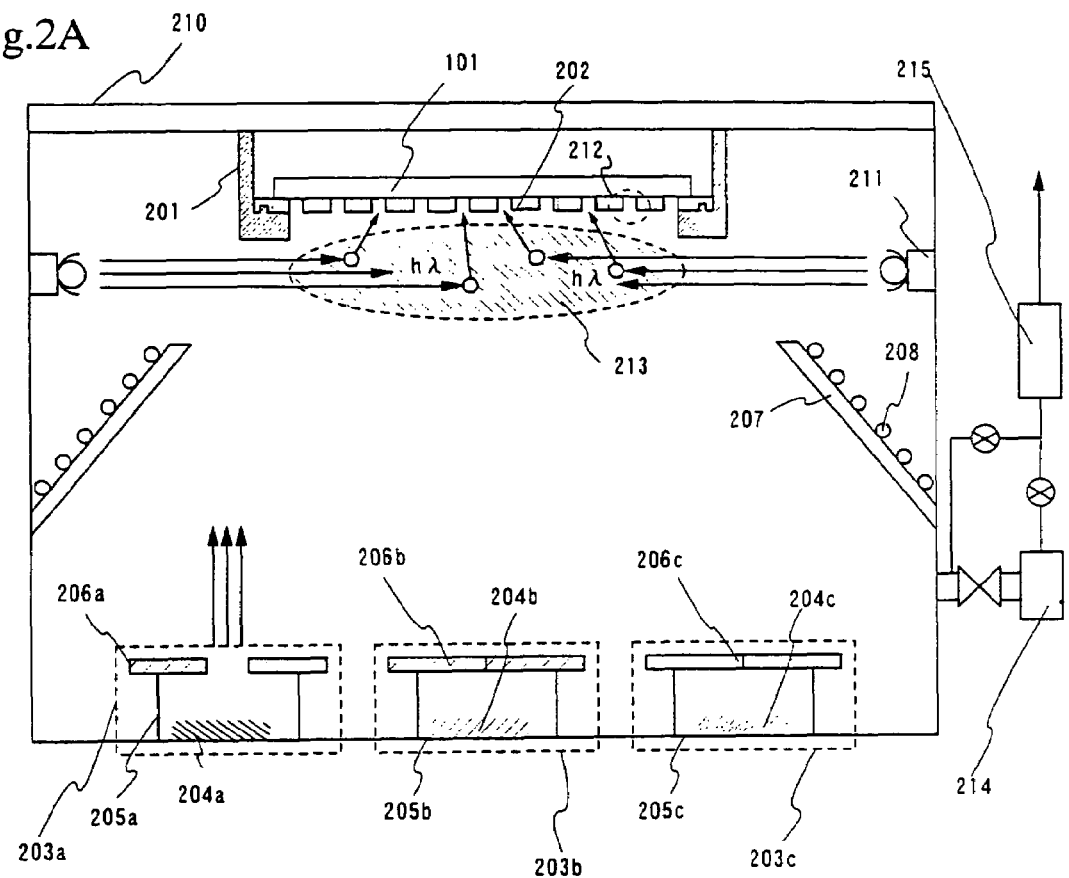
FIGS. 2A and 2B are explanatory views of a film formation chamber.
Figure 2B:
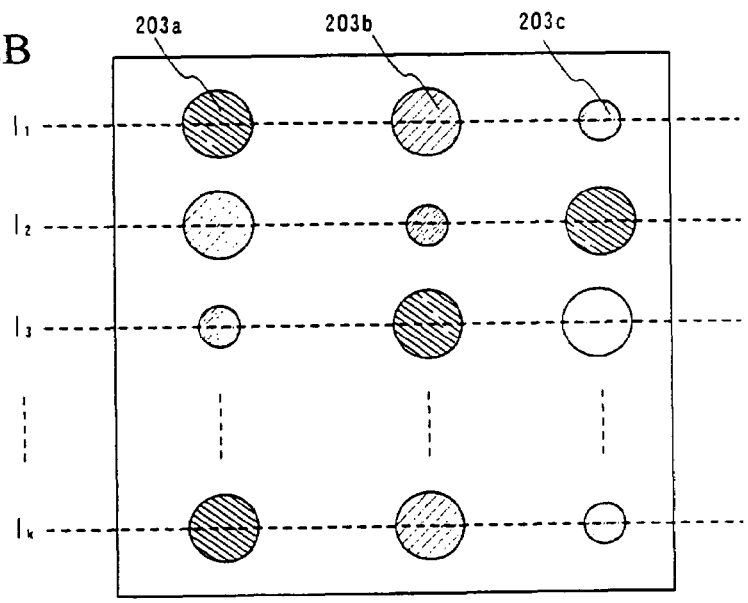
Figure 3A:
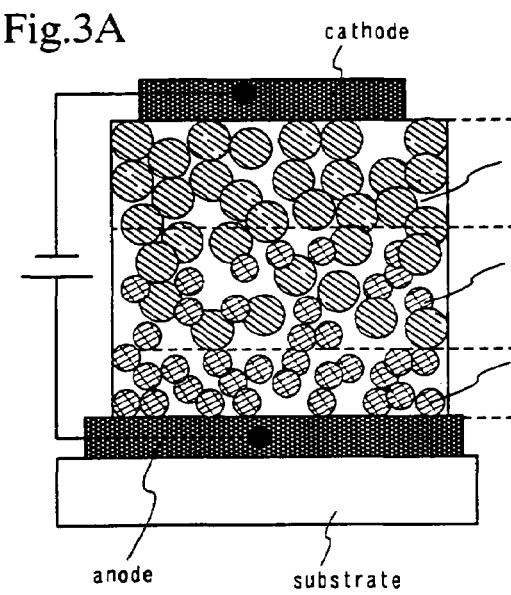
FIGS. 3A and 3B are explanatory views of the structure of the element.
Figure 3B:
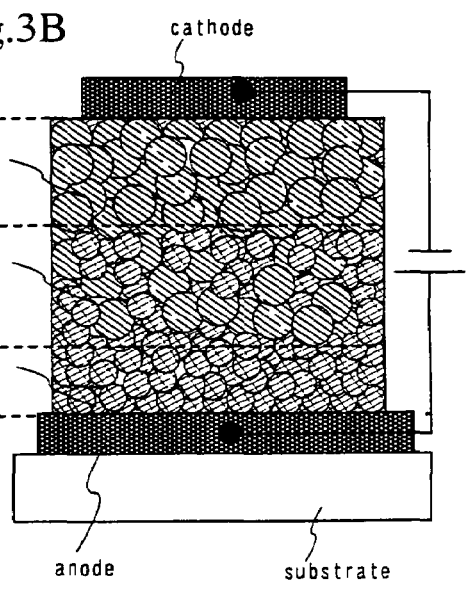

In the first film formation chamber 405, the organic compounds set in these evaporation sources are vapor-deposited in order by using the method described using FIGS. 2A and 2B to form a first organic compound film (here, red) including a plurality of functional regions.

Then, the substrate 404 is transferred to a second alignment chamber 407. In the second alignment chamber 407, the substrate 404 is separated from the metallic mask 403 and the metallic mask 403 is aligned to a position in which a second organic compound film is formed. After the alignment is completed, the substrate 404 and the metallic mask 403 are overlapped again and held.

Then, the substrate 404 is transferred to a second film formation chamber 408. Similarly, the second film formation chamber 408 also includes a plurality of evaporation sources. As in the case of the first film formation chamber 405, a plurality of organic compounds are vapor-deposited in order to form a second organic compound film (here, green) including regions with a plurality of functions.

Further, the substrate 404 is transferred to a third alignment chamber 409. In the third alignment chamber 409, the substrate 404 is separated from the metallic mask 403 and the metallic mask 403 is aligned to a position in which a third organic compound film is formed. After the alignment is completed, the substrate 404 and the metallic mask 403 are overlapped again and held.

Then, the substrate 404 is transferred to a third film formation chamber 410. Similarly, the third film formation chamber 410 also includes a plurality of evaporation sources. As in the case of the other film formation chambers, a plurality of organic compounds are vapor-deposited in order to form a third organic compound film (here, blue) including regions with a plurality of functions.

Finally, the substrate 404 is transferred to an unload chamber 411 and unloaded to the outside of the film formation apparatus.

Thus, when the alignment of the metallic mask 403 is performed in the alignment chamber every time in forming a different organic compound film, the plurality of organic compound films can be formed in the same apparatus. Since the functional regions composing one organic compound film are formed in the same film formation chamber, impurity contamination between the functional regions can be prevented. Further, since a mixed re-ion can be formed between different functional regions in the film formation apparatus of the present invention, a light emitting element which has a plurality of functions can be manufactured without indicating a clear laminate structure.

Note that, an apparatus for performing steps until formation of the organic compound film is described in this embodiment mode. However, the film formation apparatus of the present invention is not limited to this, and a structure, in which a film formation chamber for forming a cathode on the organic compound film and a processing chamber capable of sealing the light emitting element are provided, may be used. Also, the order of forming the organic compound films indicating light emissions of red, green, and blue may be an arbitrary order.

Figure 6:
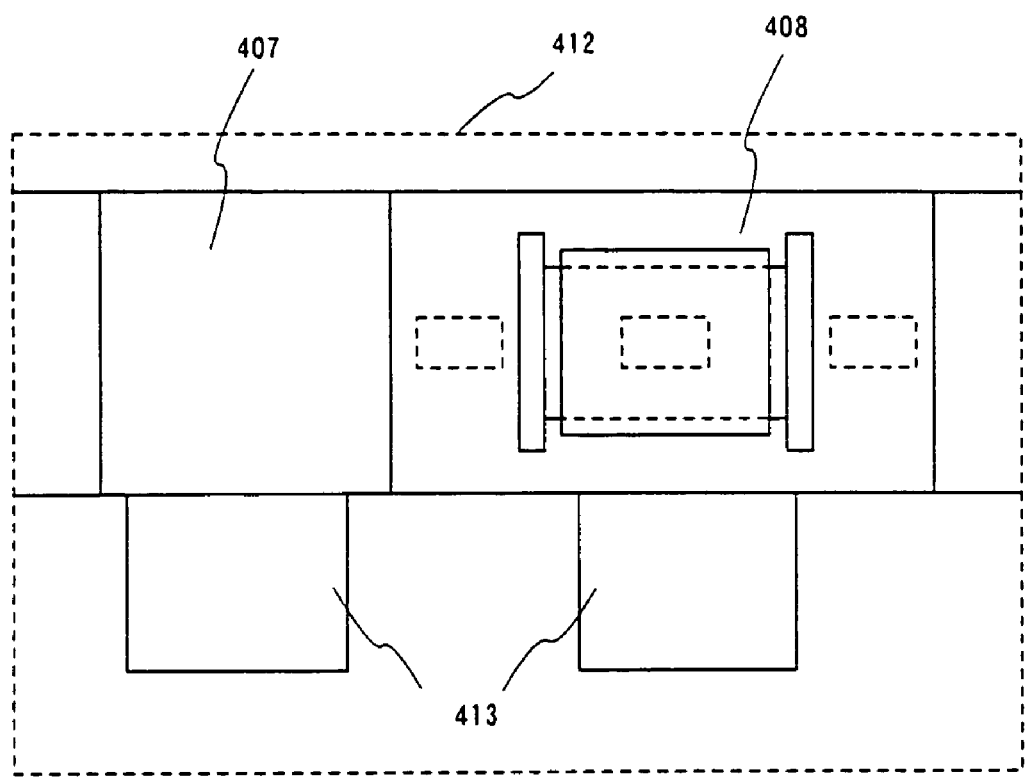
FIG. 6 is an explanatory view of a cleaning auxiliary chamber.

Further, means for cleaning the alignment chambers and the film formation chambers, which are described in this embodiment mode, may be provided. Note that, when such means is provided in a region 412 shown in FIG. 4A, cleaning auxiliary chambers 413 as shown in FIG. 6 can be provided.

When a reactive gas such as $NF_3$ or $CF_4$ is decomposed to produce a radical in the cleaning auxiliary chamber 413 and it is introduced into the second alignment chamber 407, cleanings in the second alignment chamber 407 becomes possible. Note that when a metallic mask which has been used is set in advance in the second alignment chamber 407, cleaning of the metallic mask can be performed. Also, when the radical is introduced into the second film formation chamber 408, the interior of the second film formation chamber 408 can be cleaned. The second alignment chamber 407 and the second film formation chamber 408 are respectively connected with the cleaning auxiliary chambers 413, through gates (not shown). The gates may be opened upon introduction of the radical.

Embodiment 1

Figure 7:
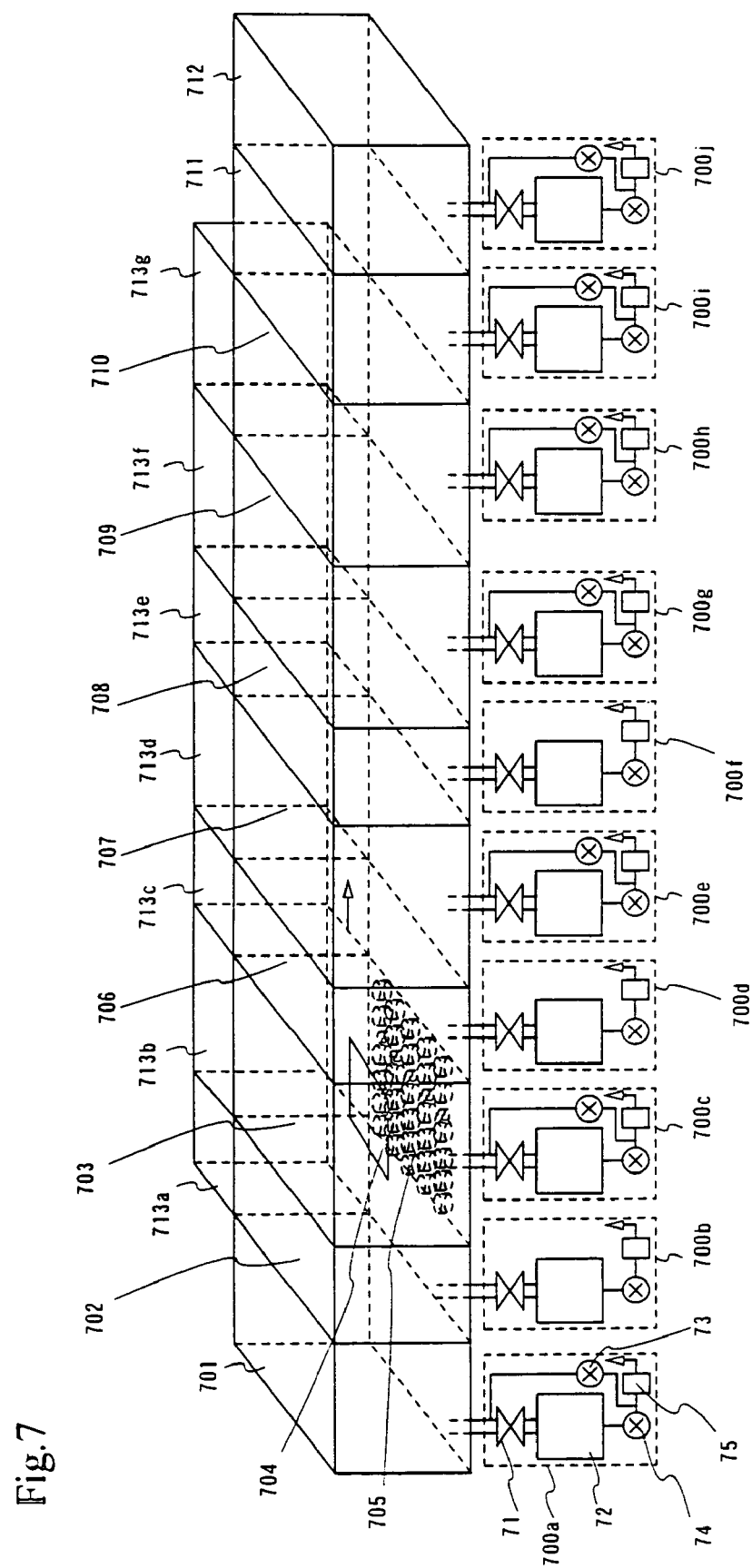
FIG. 7 is an explanatory view of the film formation apparatus.

The case where a film formation apparatus of the present invention is an in-line stem will be described using FIG. 7. In FIG. 7, reference numeral 701 denotes a load chamber and a substrate is transferred therefrom. Note that the substrate as described in this embodiment is a substrate on which the anode or the cathode (anode in this embodiment) of a light emitting element has been formed. The load chamber 701 includes an exhaust system 700a. The exhaust system 700a is composed of a first valve 71, a cryopump 72, a second valve 73, a third valve 74, and a dry pump 75.

The degree of vacuum to be reached in the film formation chamber is desirably $10^{-6}$ or less. Thus, an exhaust pump with an exhaust rate of 10000 l/s or higher is preferably used.

According to this embodiment, with respect to respective processing chambers such as a load chamber, alignment chambers, film formation chambers, a sealing chamber, and an unload chamber which are shut by the gates, a material such as aluminum or stainless (SUS) that is mirror-finished by electropolishing is used for the inner wall surface because absorption of an impurity such as oxygen or water can be decreased by reducing the surface area. Also, an inner member made of a material such as ceramics which is processed so as to have extremely few pores is used. These materials have a surface evenness such that their average surface roughness is 5 nm or less (preferably, 3 nm or less). The "average surface roughness" as described here is a roughness such that a center line average roughness as defined by JIS B0601 is extended three-dimensionally so as to be applied to a surface.

In addition, there is also a method of forming an active surface on the inner wall of the film formation chamber using a material easy to react with a gas, Ti, Zr, Nb, Ta, Cr, Mo, W, La, Ba, or the like is preferably used as such a material in this case.

The first valve 71 is a main valve with a gate valve. However, there is a case where a butterfly valve which also serves as a conductance valve is used. The second valve 73 and the third valve 74 are fore valves. First, the second valve 73 is opened and a pressure of the load chamber 701 is roughly reduced by the dry pump 75. Then, the first valve 71 and the third valve 74 are opened and a pressure of the load chamber 701 is reduced to a high vacuum by the cryopump 72. Instead of the cryopump, a turbo molecular pump or a mechanical booster pump may he used. Also, the cryopump may be used after the degree of vacuum is improved by the mechanical booster pump.

Next, reference numeral 702 denotes an alignment chamber. Here, alignment of the metallic mask and arrangement of the substrate onto the metallic mask are performed for film formation in the film formation chamber to which the substrate is transferred next. This is called an alignment chamber (A) 702. Note that the alignment here is preferably performed by the method described using FIGS. 4A and 4B. The alignment chamber (A) 702 includes an evaporation system 700b. The alignment chamber (A) 702 is hermetically shut to the load chamber 701 by a gate (not shown).

A cleaning auxiliary chamber 713a is further provided in the alignment chamber (A) 702. When a reactive gas such as $NF_3$ or $CF_4$ is decomposed to produce radicals in the cleaning auxiliary chamber 713a and the radicals are introduced into the alignment chamber (A) 702, cleaning in the alignment chamber (A) 702 becomes possible. Note that when a metallic mask which has been used is set in advance in the alignment chamber (A) 702, cleaning of the metallic mask can be performed.

Next, reference numeral 703 denotes a film formation chamber for forming a first organic compound film by an evaporation method. This is called a film formation chamber (A). The film formation chamber (A) 703 is provided with an exhaust system 700c. The film formation chamber (A) 703 is hermetically shut to the alignment chamber (A) 702 by a gate (not shown).

A cleaning auxiliary chamber 713b is provided to the film formation chamber (A) 703 as in the case of the alignment chamber (A) 702. Note that, when a radical produced by decomposing a reactive gas such as NF or CF, is introduced into the film formation chamber (A) 703, the interior of the film formation chamber (A) 703 can be cleaned.

In this embodiment, a film formation chamber having the structure shown in FIG. 2A is provided as the film formation chamber (A) 703, in which a first organic compound film indicating light emission of red color is formed. A first evaporation source including an organic compound with a hole injection property, a second evaporation source including an organic compound with a hole transport property a third evaporation source including an organic compound with a hole transport property as a host of an organic compound with a light emitting property, a fourth evaporation source including an organic compound with a light emitting property, a fifth evaporation source including an organic compound with a blocking property, and a sixth evaporation source including an organic compound with an electron transport property are included as evaporation sources.

Also, in this embodiment, copper phthalocyanine (hereinafter referred to as Cu-Pc) is used as the organic compound with the hole injection property, which is included in the first evaporation source. In addition, 4,4'-bis[N-(1-naphthyl)-N-phenyl-amino]-biphenyl (hereinafter referred to as á-NPD) is used as the organic compound with the hole transport property, which is included in the second evaporation source. In addition, 4,4'-dicarbazole-biphenyl (hereinafter referred to as CBP) is used as the organic compound as a host (hereinafter referred to as a host material), which is included in the third evaporation source. In addition, 2,3,7,8,12,13,17,18-octaethyl-21H, 23H-porphyrin-platinum (hereinafter referred to as PtOEP) is used as the organic compound with the light emitting property, which is included in the fourth evaporation source. In addition, bathocuproine (hereinafter referred to as BCP) is used as the organic compound with the blocking property, which is included in the fifth evaporation source. In addition, tris(8-quinolinolato) aluminum (hereinafter referred to as $Alq_3$) is used as the organic compound with the electron transport property, which is included in the sixth evaporation source.

When these organic compounds are vapor-deposited in order, the organic compound film including regions with functions of the hole injection property, the hole transport property, the light emitting property, the blocking property, and the electron transport property can be formed on the anode.

Also, in this embodiment, in order to form a mixed region in an interface between different functional regions, organic compounds for forming the both adjacent functional regions are simultaneously vapor-deposited. That is, mixed regions are formed respectively in an interface between a hole injection region and a hole transport region, an interface between the hole transport region and a hole transport region including a light emitting region, an interface between the hole transport region including the light emitting region and a blocking region, and an interface between the blocking region and an electron transport region.

Specifically, after Cu-Pc is formed at a film thickness of 15 nm to produce a first functional region, Cu-Pc and á-NPD are simultaneously vapor-deposited to produce a first mixed region at a film thickness of 5 to 10 nm. Then, á-NPD is formed at a film thickness of 40 nm to produce a second functional region. After that, á-NPD and CBP are simultaneously vapor-deposited to produce a second mixed region at a film thickness of 5 to 10 nm and then CBP is formed at a film thickness of 25 to 40 nm to produce a third functional region. Here, CBP and PtOEP are simultaneously vapor-deposited during the entire period for forming the third functional region or a predetermined period thereof to produce a third mixed region over the entire third functional region or a part thereof. The third mixed region is produced at a film thickness of 5 to 40 nm. Note that, here, the third mixed region has a light emitting property. Next, after CBP and BCP are simultaneously vapor-deposited at a film thickness of 5 to 10 nm to produce a fourth mixed region, BCP is formed at a film thickness of 8 nm to produce a fourth functional region. Further, BCP and $Alq_3$ are simultaneously vapor-deposited to produce a fifth mixed region at a film thickness of 5 to 10 nm. Finally, $Alq_3$ is formed at a film thickness of 25 nm and thus a fifth functional region can be produced. Thus, the first organic compound film is formed.

Note that the case where six kinds of organic compounds having different functions are included in six evaporation sources, respectively, and these organic compounds are vapor-deposited to form an organic compound film as the first organic compound film is described here. However, the present invention is not limited to such a case, as far as plural kinds of organic compounds are used. Also, one evaporation source does not necessarily include one kind of organic compound and may additionally include another organic compound. For example, an evaporation source may include an organic compound which will be a dopant, in addition to the one kind of material included as the organic compound with the light emitting property. Known materials may be used as organic compounds for forming the organic compound film which has the plurality of functions and indicates light emission of red color.

The respective evaporation sources are preferably made such that the film formation rate can be controlled by a microcomputer. In this way, it is preferable that the mixing ratio can be controlled when the plurality of organic compounds are simultaneously formed into a film.

Next, reference numeral 706 denotes an alignment chamber. Here, alignment of the metallic mask and arrangement of the substrate onto the metallic mask are performed for film formation in the film formation chamber to which the substrate is transferred next. This is called an alignment chamber (B) 706. Note that the alignment is preferably performed by the method described using FIGS. 4A and 4B. The alignment chamber (B) 706 includes an exhaust system 700d. The alignment chamber (B) 706 is hermetically shut to the film formation chamber (A) 703 by a gate (not shown). The alignment chamber (B) 706 includes a cleaning auxiliary chamber 713c that is hermetically shut by a gate (not shown), as in the case of the alignment chamber (A) 702.

Next, reference numeral 707 denotes a film formation chamber for forming a second organic compound film by an evaporation method. This is called a film formation chamber (B). The film formation chamber (B) 707 includes an evaporation system 700e. The film formation chamber (B) 707 is hermetically shut to the alignment chamber (B) 706 by a gate (not shown). Further, the film formation chamber (B) 707 includes a cleaning auxiliary chamber 713d hermetically shut by a gate (not shown) as in the case of the film formation chamber (A) 703.

In this embodiment, a film formation chamber having the structure shown in FIG. 2A is provided as the film formation chamber (B) 707 and a second organic compound film indicating light emission of green color is formed. A first evaporation source including an organic compound with a hole injection property, a second evaporation source and third evaporation source, each including an organic compound with a hole transport property, a fourth evaporation source including a host material with a hole transport property, a fifth evaporation source including an organic compound with a light emitting property, a sixth evaporation source including an organic compound with a blocking property, and a seventh evaporation source including an organic compound with an electron transport property are included as evaporation sources.

Also, in this embodiment, Cu-Pc is used as the organic compound with the hole injection property, which is included in the first evaporation source. MTDATA is used as the organic compound with the hole transport property, which is included in the second evaporation source. Further, á-NPD is used as the organic compound with the hole transport property, which is included in the third evaporation source. CBP is used as the host material with the hole transport property, which is included in the fourth evaporation source. Tris(2-phenylpyridine) iridium (Ir(ppy)$_3$) is used as the organic compound with the light emitting property, which is included in the fifth evaporation source. BCP is used as the organic compound with the blocking property, which is included in the sixth evaporation source. Alq$_3$ is used as the organic compound with the electron transport property, which is included in the seventh evaporation source.

When these organic compounds are vapor-deposited in order, the second organic compound film including regions with functions of the hole injection property, the hole transport property, the light emitting property, the blocking property and the electron transport property can be formed on the anode.

Also, in this embodiment, in order to form a mixed region in an interface between different functional regions, organic compounds for forming the both adjacent functional regions are simultaneously vapor-deposited. That is, respective mixed regions are formed in an interface between a hole injection layer and a hole transport layer, an interface between the hole transport region and a hole transport region including a light emitting region, an interface between the hole transport region including the light emitting region and a blocking region, and an interface between the blocking region and an electron transport region.

Concretely, after Cu-Pc is formed at a film thickness of 10 nm to produce a first functional region. Cu-Pc and MTDATA are simultaneously vapor-deposited to produce a first mixed re-ion at a film thickness of 5 to 10 nm. Then, MTDATA is formed at a film thickness of 20 nm to produce a second functional region and MTDATA and á-NPD are simultaneously vapor-deposited to produce a second mixed region at a film thickness of 5 to 10 nm. Then, á-NPD is formed at a film thickness of 10 nm to produce a third functional region and á-NPD and CBP are simultaneously vapor-deposited to produce a third mixed region at a film-n thickness of 5 to 10 nm. Then, CBP is formed at a film thickness of 20 to 40 nm to produce a fourth functional region. Here, CBP and Ir(ppy)$_3$ are simultaneously vapor-deposited during the entire period for forming the fourth functional region or a predetermined period thereof to produce a fourth mixed region in the entire fourth functional region or a portion thereof. The fourth mixed region is produced at a film thickness of 5 to 40 nm. Note that the fourth mixed region has a light emitting property. Next, after CBP and BCP are simultaneously vapor-deposited to produce a fifth mixed region at a film thickness of 5 to 10 nm, BCP is formed at a film thickness of to 10 nm to produce a fifth functional region. Further, BCP and Alq$_3$ are simultaneously vapor-deposited to produce a sixth mixed region at a film thickness of 5 to 10 nm. Finally, Alq$_3$ is formed at a film thickness of 40 nm and thus a sixth functional region can be produced. Therefore, the second organic compound film is formed.

Note that the case, where organic compounds with different functions are included in seven evaporation sources respectively and these organic compounds are vapor-deposited to form an organic compound film as the second organic compound film, has been described above. However, the present invention is not limited to such a case, as far as plural organic compounds are used. Known materials may be used as organic compounds for forming the organic compound film which has the plurality of functions and indicates light emission of green color.

Note that the respective evaporation sources are preferably made such that the film formation rate can be controlled by a microcomputer. In this way, it is preferable that the mixing ratio can be controlled when the plurality of organic compounds are simultaneously formed into a film.

Next, reference numeral indicated by 708 denotes an alignment chamber. Here, alignment of the metallic mask and arrangement of the substrate onto the metallic mask are performed for film formation in the film formation chamber to which the substrate is transferred next. This is called an alignment chamber (C) 708. Note that the alignment is preferably performed by the method described using FIGS. 4A and 4B. The alignment chamber (C) 708 includes an exhaust system 700*f*. The alignment chamber (C) 708 is hermetically shut to the film formation chamber (B) 707 by a gate (not shown). The alignment chamber (C) 708 includes a cleaning auxiliary chamber 713*e* hermetically shut by a gate (not shown) as in the case of the alignment chamber (A) 702.

Next, reference numeral 709 denotes a film formation chamber for forming a third organic compound film by an evaporation method. This is called a film formation chamber (C). The film formation chamber (C) 709 includes an exhaust system 700*g*. The film formation chamber (C) 709 is hermetically shut to the alignment chamber (C) 708 by a gate (not shown). Further, the film formation chamber (C) 709 includes a cleaning auxiliary chamber 713*f* hermetically shut by a gate (not shown) as in the case of the film formation chamber (A) 703.

In this embodiment, a film formation chamber having the structure shown in FIG. 2A is provided as the film formation chamber (C) 709 and the third organic compound film indicating light emission of blue color is formed. A first evaporation source including an organic compound with a hole injection property, a second evaporation source including an organic Compound with a light emitting property, a third evaporation source including an organic compound with a blocking property, and a fourth evaporation source including an organic compound with an electron transport property are included as evaporation sources.

Also, in this embodiment, Cu-Pc is used as the organic compound with the hole injection property, which is included in the first evaporation source. Further. á-NPD is used as the organic compound with the light emitting property, which is included in the second evaporation source. BCP is used as the organic compound with the blocking property, which is included in the third evaporation source. Alq$_3$ is used as the organic compound with the electron transport property, which is included in the fourth evaporation source.

Note that, when these organic compounds are vapor-deposited in order, the third organic compound film including regions with functions of the hole injection property the light emitting property, the blocking property, and the electron transport property can be formed on the anode.

Also, in this embodiment, in order to form a mixed region in an interface between different functional regions, organic compounds for forming the both adjacent functional regions are simultaneously vapor-deposited. That is, mixed regions are formed respectively in an interface between a hole injection region and a light emitting region, an interface between the light emitting region and a blocking region, and an interface between the blocking region and an electron transport region.

Concretely, after Cu-Pc is formed at a film thickness of 20 nm to produce a first functional region, Cu-Pc and á-NPD are simultaneously vapor-deposited to produce a first mixed region at a film thickness of 5 to 10 nm. Then, á-NPD is formed at a film thickness of 40 nm to produce a second functional region and á-NPD and BCP are simultaneously vapor-deposited to produce a second mixed region at a film thickness of 5 to 10 nm. Then, BCP is formed at a film thickness of 10 nm to produce a third functional region and BCP and Alq, are simultaneously vapor-deposited to produce a third mixed region at a film thickness of 5 to 10 nm. Finally, Alq is formed at a film thickness of 40 nm and thus a fourth functional region can be produced. Therefore, the third organic compound film is formed.

Note that the case where four kinds of organic compounds having different functions are included in four evaporation sources respectively and these organic compounds are vapor-deposited in order to form an organic compound film as the third organic compound film is described here. However, the present invention is not limited to such a case and plural kinds of organic compounds are preferably used. Also, one evaporation source does not necessarily include one kind of organic compound and may include plural kinds of organic compounds. For example, an evaporation source may include another organic compound which can be a dopant in addition to one kind of material included as the organic compound with the light emitting property. Known materials may be used as organic compounds for forming the organic compound film which has the plurality of functions and indicates light emission of blue color.

Note that the respective evaporation sources are preferably made such that the film formation rate can be controlled by a microcomputer. In this way, it is preferable that the mixing ratio can be controlled when the plurality of organic compounds are simultaneously formed into a film.

Also, the case, where the organic compound film indicating light emission of red color is formed in the film formation chamber (A) 703 of the first film formation chamber, the organic compound film indicating light emission of green color is formed in the film formation clamber (B) 707 of the second film formation chamber, and the organic compound film indicating light emission of blue color is formed in the film formation chamber (C) 709 of the third film formation chamber, is described in this embodiment. However, the formation order is not limited to this, and any one of the organic compound film indicating light emission of red color, the organic compound film indicating light emission of green color, and the organic compound film indicating light emission of blue color may be formed in the film formation chamber (A) 703, the film formation chamber (B) 707, or the film formation chamber (C) 709. Further, another film formation chamber may be provided for forming an organic compound film indicating light emission of while color.

Next, reference numeral 710 denotes a film formation chamber for forming a conductive film (metallic film as the cathode in this embodiment) as the anode or the cathode of a light emitting element by an evaporation method. This is called a film formation chamber (D). The film formation chamber (D) 710 includes an exhaust system 700*h*. The film formation chamber (D) 710 is hermetically shut to the film formation chamber (C) 709 by a gate (not shown). Further, the film formation chamber (D) 710 includes a cleaning auxiliary chamber 713*g* hermetically shut by a gate (not shown) as in the case of the film formation chamber (A) 703.

In this embodiment, an Al—Li alloy film (alloy film of aluminum and lithium) is formed as a conductive film for the cathode of the light emitting element by an evaporation method in the film formation chamber (D) 710. Note that an element which belongs to group 1 or group 2 of the periodic table and aluminum may be vapor-deposited together at this time.

Also, in the film formation chamber (A) 703, the film formation chamber (B) 707, the film formation chamber (C) 709, and the film formation chamber (D) 710, mechanisms for heating the inner portions of the respective film formation chambers are provided. Thus, a part of impurities in the film formation chambers can be removed.

Further, as an exhaust pump included in the respective film formation chambers, a dry pump, a mechanical booster pump, a turbo molecular pump (magnetic levitation type), a cry pump, or the like can be used. In this embodiment, it is desirable that both a cryopump and a dry pump are used.

Also pressures in the film formation chamber (A) 703, the film formation chamber (B) 707, the film formation chamber (C) 709, and the film formation chamber (D) 710 are reduced by exhaust pumps. At this time, the degree of vacuum to be reached is desirably $10^{-6}$ Pa or more. For example, when a cryopump having an exhaust rate of 10000 l/s ($H_2O$) is used and a surface area of the inner portion of the film formation chamber is 10 $m^2$, the inner portion of the film formation chamber is preferably made of a material such as aluminum with a leak rate of $4.1 \times 10^{-7}$ $Pa \cdot m^3 \cdot s^{-1}$ or less for 20 hours. In order to obtain such a degree of vacuum, it is effective that the surface area of the inner portion of the film formation chamber is reduced by electropolishing.

Also, here, a CVD chamber may be provided to form an insulating film such as a silicon nitride film, a silicon oxnitride film, or a DLC film as a protective film (passivation film) of the light emitting element. When the CVD chamber is provided, a gas purifying unit for improving the degree of purity of a material as used in the CVD chamber in advance is preferably provided.

Next, reference numeral 711 denotes a sealing chamber and includes an exhaust system 700*i*. The sealing chamber 711 is hermetically shut to the film formation chamber (D) 710 by a gate (not shown). Note that the sealing chamber 711 becomes in a vacuum state. When a plurality of substrates each having a light emitting element in which the cathode has been formed are transferred to the sealing chamber, the gate is closed, the sealing chamber 711 becomes in an atmospheric pressure state by using an inert gas (nitrogen, helium, argon, or the like), and finally processing for enclosing the light emitting element in a hermetic space is performed. A transfer mechanism (not shown) is provided in the sealing chamber 711 and thus the substrate is unloaded from the film formation chamber (D) 710. Here, the sealing processing here is for protecting the formed light emitting element from oxygen and moisture and means of performing mechanical sealing using a cover member or sealing using a heat curable resin or an ultraviolet light curable resin is used for this processing.

Also, a cover member is provided in advance in the sealing chamber. Glass, ceramic, plastic, or metal can be used for the cover member. However, when light is emitted to the cover member side, it is required that the cover member is transparent. The cover member is bonded to the substrate on which the above light emitting element is formed by using a seal member made of a heat curable resin, an ultraviolet light curable resin, or the like and then the resin is cured by thermal treatment or ultraviolet light irradiation processing to produce the hermetic space. It is also effective to provide a moisture absorption agent represented by barium oxide in the hermetic space. Bonding between the substrate on which the light emitting element is formed and the cover member is performed after alignment by an alignment mechanism connected with a CCD camera. In addition, a mechanism for automatically processing application of a sealing agent and addition of a moisture absorption addition is also provided.

Also, a space between the cover member and the substrate on which the light emitting element is formed can be filled with a heat curable resin or an ultraviolet light curable resin. In this case, it is effective to add a moisture absorption agent represented by barium oxide into the heat curable resin or the ultraviolet light curable resin.

In the film formation apparatus shown in FIG. 7, a mechanism for irradiating ultraviolet light (hereinafter referred to as an ultraviolet light irradiation mechanism) is provided in the inner portion of the sealing chamber 711 and an ultraviolet light curable resin is cured with ultraviolet light emitted from the ultraviolet light irradiation mechanism.

Finally, reference numeral 712 denotes an unload chamber and includes an exhaust system 700j. The substrate on which the light emitting element is formed is taken out from this chamber.

Further, the case where a function that an organic compound can be exchanged is provided in a film formation chamber included in the film formation apparatus described in this embodiment, is shown in FIGS. 8A and 8B and a detailed structure of the sealing chamber 711 is shown in FIG. 8C.

In FIG. 8A, a substrate 802 is set in the film formation chamber 801. Organic compounds for forming an organic compound film on the substrate are included in an evaporation source 803. Note that, here, the evaporation sources 803 are included in a material exchange chamber 804 separated from the film formation chamber 801 in which the substrate is located through a gate 805. Therefore, in this embodiment, when the gate 805 is closed, the material exchange chamber 804 is separated from the film formation chamber 801. The pressure inside the material exchange chamber 804 which is in a vacuum state is returned to an atmospheric pressure by an exhaust system 806 and then the material exchange chamber 804 is pulled as shown in FIG. 8A. Thus, addition or exchange of organic compounds to the evaporation sources of the material exchange chamber 804 can be performed.

Then, after the addition or the exchange of the organic compounds is completed, the material exchange chamber 804 is again returned to its original location as shown in FIG. 8B. Then, when the inner portion becomes in a vacuum state by the exhaust system 806 and becomes in the same pressure state as the film formation chamber, the gate 805 is opened and thus evaporation from the evaporation sources 803 to the substrate 802 is allowed, Note that a heater for heating exchanged materials is provided in the material exchange chamber 804. When the materials are heated in advance, an impurity such as water can be removed. A heating temperature at this time is preferably 200° C. or lower.

Also, as shown in FIG. 8C, a plurality of processing mechanisms are included in the sealing chamber 711. A plurality of cover members used in sealing are located in a stock position 811. The substrate for sealing processing is transferred from the film formation chamber (D) 710 by a transfer mechanism (A) 812 and temporally stored in a storage location 813.

When a predetermined number of substrates are stored in the storage location 813, the sealing chamber becomes a hermetic space by the gate and then becomes in an atmospheric pressure state by using an inert gas (nitrogen, argon, helium, or the like).

When the sealing chamber becomes in an atmospheric pressure state, the substrates are processed one by one. First, the substrate is transferred from the storage position 813 to In alignment mechanism 814 by the transfer mechanism (A) 812. At this time, a sealing agent and a moisture absorption agent are set on the substrate. Then, the cover member is transferred from the stock position 811 to the alignment mechanism 814 by a transfer mechanism (B) 815 and bonded to the substrate.

Then, ultraviolet light is irradiated from an ultraviolet light irradiation mechanism (not shown) to complete sealing of the substrate. After the completion of sealing, the substrate is transferred to the unload chamber 712 by a transfer mechanism (C) 816 and taken out.

As described above, when the film formation apparatus shown in FIG. 7 (or FIGS. 5A to 8C) is used, the light emitting element is not exposed to outside air until the light emitting element is completely sealed into the hermetic space. Thus, the light emitting device having high reliability can be manufactured.

Embodiment 2

Figure 9A:
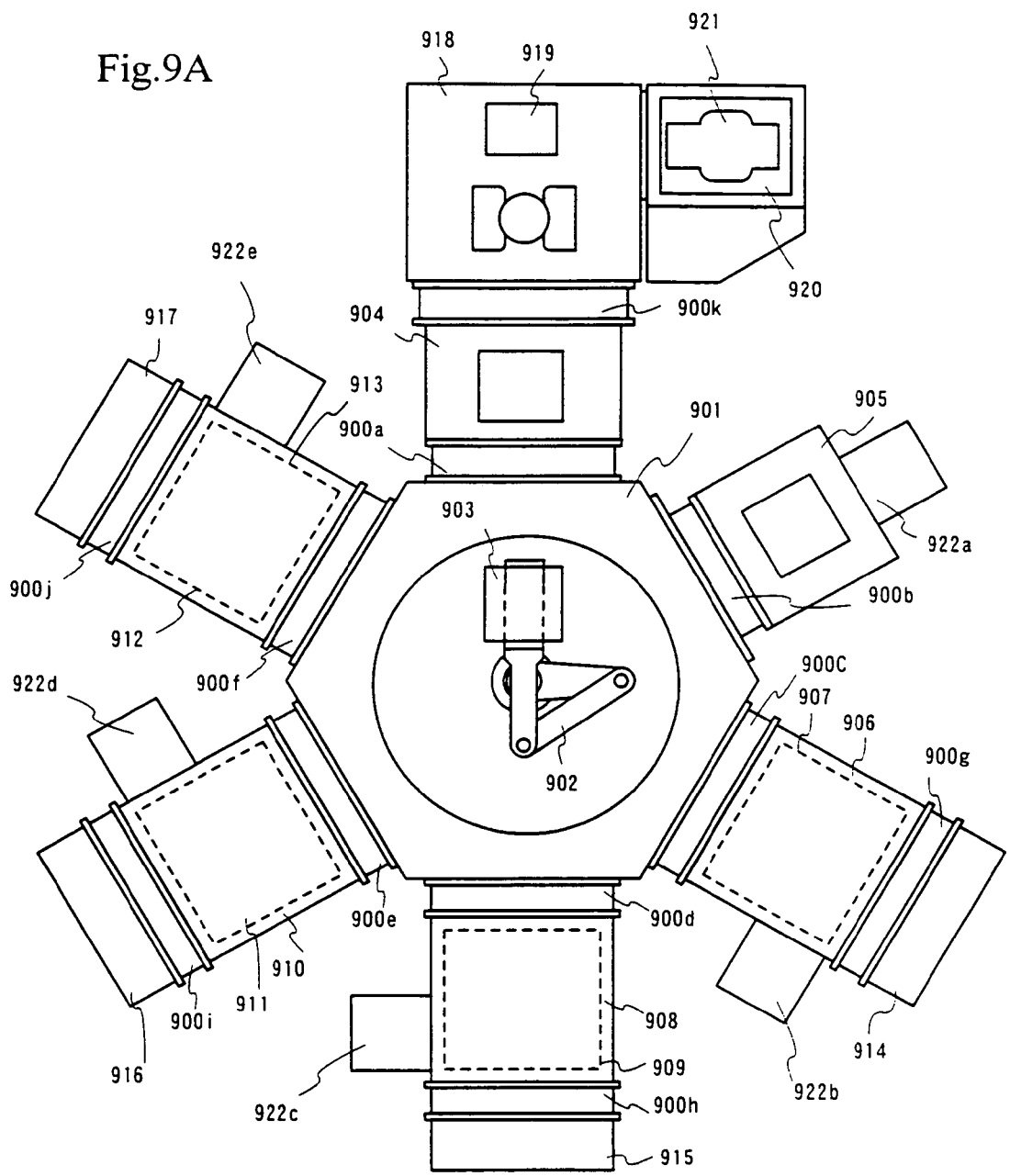
FIGS. 9A and 9B are explanatory views of the film formation apparatus.

A film formation apparatus of the present invention will be described using FIGS. 9A and 9B. In FIG. 9A, reference numeral 901 denotes a transfer chamber. A transfer mechanism (A) 902 is included in the transfer chamber 901 and transfers a substrate 903. The transfer chamber 901 is kept in a low pressure atmosphere and connected with respective processing chambers through gates. Transfer of the substrate to and from the respective processing chambers is performed by the transfer mechanism (A) 902 at the time when the gate is opened. When the pressure of the transfer chamber 901 is reduced, an exhaust pump such as a dry pump, a mechanical booster pump, a turbo molecular pump (magnetic levitation type), or a cryopump can be used. A cryopump that is excellent in removal of water and the like are desirably used together with a dry pump.

Hereinafter, the respective processing chambers will be described. Note that, since the transfer chamber 901 becomes in an atmosphere of reduced pressure, exhaust pumps (not shown) are provided in all processing chambers directly connected with the transfer chamber 901. A dry pump, a mechanical booster pump, a turbo molecular pump (magnetic levitation type), or a cryopump, which is described above, is used as the exhaust pump. Here, a cryopump is preferably used together with a dry pump.

Reference numeral 904 denotes a load chamber for setting (locating) a substrate. The load chamber 904 is connected with the transfer chamber 901 through a gate 900a and a carrier (not shown) in which the substrate 903 is set is located therein. Note that the load chamber 904 also serves as a transfer chamber for transferring the substrate in which formation of the element is completed to a sealing chamber. The load chamber 904 may include a substrate load room and a substrate unload room, which are separated from each other. Also, the load chamber 904 includes the above exhaust pump and a puree line for introducing a nitrogen gas or a noble gas with high purity. A cryopump is desirable as the exhaust pump. Further, the puree line includes a gas purifying unit and thus impurities (oxygen and water) of the gas introduced into the apparatus are removed in advance.

Note that, a substrate on which a transparent conductive film as the anode of a light emitting element has been formed is used as the substrate 903 in this embodiment. In this embodiment, the substrate 903 is set in the carrier so that a surface to be film-formed is located downward because a face down method (also referred to as a deposition up method) is easily performed in later film formation by an evaporation method. The face down method is a method of performing film formation in a state where the surface to be film-formed of the substrate is located downward. According to this method, for example, the adhesion of dust can be suppressed.

Next, reference numeral 905 denotes an alignment chamber for performing alignment of a metallic mask, and alignment between a substrate on which the anode or the cathode (anode in this embodiment) of a light emitting element has been formed and the metallic mask. The alignment chamber 905 is connected with the transfer chamber 901 through a gate 900b. Note that the alignment of the metallic mask and the alignment between the substrate and the metallic mask are performed in the alignment chamber each time when a different organic compound film is formed. Also, when a CCD (charge coupled device) known as an image sensor is provided in the alignment chamber 905, the alignment between the substrate and the metallic mask call he performed with high precision in film formation using the metallic mask. The alignment of the metallic mask is preferably performed by the method described with FIGS. 4A and 4B.

Further, a cleaning auxiliary chamber 922a is connected with the alignment chamber 905. The cleaning auxiliary chamber 922a is constructed as shown in FIG. 9B. A µ-wave generator 931 for generating a µ-wave is provided and the µ-wave generated therein is transmitted to a plasma discharge tube 933 through a waveguide tube 932. Note that, µ-waves about 2.45 GHz are emitted from the µ-wave generator 931 used here. Also, a reactive gas is supplied from a gas introduction tube 934 to the plasma discharge tube 933. Here, $NF_3$ is used as the reactive gas. Note that another reactive gas such as $CF_4$ or $ClF_3$ may be used.

Then, the reactive gas is decomposed by the u-wave in the plasma discharge tube 933 to produce a radical. The radical is passed through the gas introduction tube 934 and introduced into the alignment chamber 905 connected therewith through a gate (not shown). Note that a reflecting plate 935 is preferably provided in the plasma discharge tube 933 in order to effectively supply the µ-wave.

Then, a metallic mask on which an organic compound film is deposited is set in the alignment chamber 905. When a gate (not shown) provided between the cleaning auxiliary chamber 922a and the alignment chamber 905 is opened, the radical can be introduced into the alignment chamber 905. Thus, the metallic mask can be cleaned.

When the µ-wave plasma is used, the reactive gas can be made to be in a radical state with high efficiency. Thus, the probability of generating an impurity such as a by-product becomes lower. Also, since this mechanism is different from the case of common radical generation, there is no case where the generated radical is accelerated. Further, since no radical is generated in the film formation chamber, damages to the inner portion of the film formation chamber and the metallic mask by plasma can be prevented.

Note that, since cleaning of the alignment chamber using such a method is one of preferred modes, the present invention is not limited to this method. Therefore, the reactive (as is introduced into the film formation chamber to produce plasma therein and thus dry cleaning may be performed. Further, an Ar gas or the like is introduced thereto and thus physical cleaning by a sputtering method may be performed.

Next, reference numeral 90)6 denotes a film formation chamber for forming an organic compound film by an evaporation method, called a film formation chamber (A). The film formation chamber (A) 906 is connected with the transfer chamber 901 through a gate 901c. In this embodiment, a film formation chamber with the structure shown in FIGS. 2A and 2B is provided as the film formation chamber (A) 906.

In this embodiment, a first organic compound film for light emission of red color is formed in a film formation portion 907 inside the film formation chamber (A) 906. The film formation chamber (A) 906 includes a plurality of evaporation sources, concretely, a first evaporation source including an organic compound with a hole injection property, a second evaporation source including an organic compound with a hole transport property, a third evaporation source including an organic compound with a hole transport property as a host of an organic compound with a light emitting property, a fourth evaporation source including an organic compound with a light emitting property a fifth evaporation source including an organic compound with a blocking property and a sixth evaporation source including an organic compound with an electron transport property.

When these organic compounds are vapor-deposited in order, the organic compound film including regions with functions of the hole injection property, the hole transport property, the light emitting property, the blocking property, and the electron transport property can be formed on the anode.

Also, in this embodiment, in order to form a mixed region in an interface between different functional regions, both organic compounds for forming adjacent functional regions are simultaneously vapor-deposited. That is, mixed regions are formed respectively in an interface between a hole injection region and a hole transport region, an interface between the hole transport region and a hole transport region including a light emitting region, an interface between the hole transport region including the light emitting region and a blocking region, and an interface between the blocking region and an electron transport region.

Note that the case where six kinds of different organic compounds are included in six evaporation sources respectively and these organic compounds are vapor-deposited in order to form an organic compound film as the first organic compound film has been described above. However, the present invention is not limited to the above case and plural kinds of organic compounds are preferably used. Also, one evaporation source does not necessarily include one kind of organic compound and may include plural kinds of organic compounds. For example, an evaporation source may include another organic compound which is able to be a dopant, in addition to the one kind of material included as the organic compound with the light emitting property. The organic compounds indicated in Embodiment 1 can be used as organic compounds for forming the organic compound film which has the plurality of functions and indicates light emission of red color. A free combination of known materials may be also used.

The film formation chamber (A) 906 is connected with a material exchange chamber 914 through a gate 900g. Note that a heater for heating exchanged organic compounds is provided in the material exchange chamber 914. When the organic compounds are heated in advance, an impurity such as water can be removed. A heating temperature at this time is preferably 200° C. or lower. Also, an exhaust pump capable of making the inner portion in a reduced pressure state is included in the material exchange chamber 914. Thus, after organic compounds are added or exchanged from the outside and thermal treatment is performed, the inner portion is made to be in a reduced pressure state. Then, when the material exchange chamber becomes in the same pressure state as the film formation chamber, the gate 900g is opened. Therefore, the organic compounds can be set in the evaporation sources inside the film formation chamber. Note that the organic compounds are set in the evaporation sources of the film formation chamber by the transfer mechanism or the like.

Note that, with respect to a film formation process in the film formation chamber (A) 906, the description of FIGS. 2A and 2B may be referred to.

A cleaning auxiliary chamber 922b is connected with the film formation chamber (A) 906 through a gate (not shown) as in the case of the alignment chamber 905. Concrete structure of the cleaning auxiliary chamber 922b is the same as the cleaning auxiliary chamber 922a. When a radical produced in the cleaning auxiliary chamber 922b is introduced into the film formation chamber (A) 906, the organic compound and the like which are deposited in the inner portion of the film formation chamber (A) 906 can be removed.

Next, reference numeral 908 denotes a film formation chamber for forming a second organic compound film by an evaporation method, called a film formation chamber (B). The film formation chamber (B) 908 is connected with the transfer chamber 901 through a gate 900d. In this embodiment, a film formation chamber with the structure shown in FIGS. 2A and 2B is provided as the film formation chamber (B) 908. In this embodiment, an organic compound film for light emission of green color is formed in a film formation portion 909 inside the film formation chamber (B) 908.

The film formation chamber (B) 908 includes a plurality of evaporation sources, concretely, a first evaporation source including an organic compound with a hole injection property, a second evaporation source and a third evaporation source, each including an organic compound with a hole transport property, a fourth evaporation source including a host material with a hole transport property, a fifth evaporation source including an organic compound with a light emitting property, a sixth evaporation source including an organic compound with a blocking property, and a seventh evaporation source including an organic compound with an electron transport property.

When these organic compounds are vapor-deposited in order, the second organic compound film including regions with functions of the hole injection property, the hole transport property, the light emitting property, the blocking property, and the electron transport property can be formed on the anode.

Also, in this embodiment, in order to form a mixed region in an interface between different functional regions, both organic compounds for forming adjacent functional regions are simultaneously vapor-deposited. That is, respective mixed regions are formed in an interface between a hole injection region and a hole transport region, an interface between the hole transport region and a hole transport region including a light emitting region, an interface between the hole transport region including the light emitting region and a blocking region, and an interface between the blocking region and an electron transport region.

Note that the case where seven kinds of organic compounds are included in seven evaporation sources respectively and these organic compounds are vapor-deposited in order to form an organic compound film as the second organic compound film has been described above. However, the present invention is not limited to the above case and plural kinds of organic compounds are preferably used. Also, one evaporation source does not necessarily include one kind of organic compound and may include plural kinds of organic compounds. For example, an evaporation source may include another organic compound which is able to be a dopant, in addition to the one kind of material included as the organic compound with the light emitting property. The organic compounds indicated in Embodiment 1 can be used as organic compounds for forming the organic compound film which has the plurality of functions and indicates light emission of green color. A free combination of known materials may be also used.

Also, the film formation chamber (B) 908 is connected with a material exchange chamber 915 through a gate 900h. Note that a heater for heating exchanged organic compounds is provided in the material exchange chamber 915. When the organic compounds are heated in advance, an impurity such as water can be removed. A heating temperature at this time is preferably 200° C. or lower. Also, an evaporation pump capable of making the inner portion in a reduced pressure state is included in the material exchange chamber 915. Thus, after organic compounds are introduced from the outside and thermal treatment is performed, the inner portion is made to be in a reduced pressure state. Then, when the material exchange chamber becomes in the same pressure state as the film formation chamber, the gate 900h is opened. Therefore, the organic compounds can be set in the evaporation sources inside the film formation chamber. Note that the organic compounds are set in the evaporation sources of the film formation chamber by the transfer mechanism or the like.

Note that, with respect to a film formation process in the film formation chamber (B) 908, the description of FIGS. 2A and 2B may be referred to.

Note that, a cleaning auxiliary chamber 922c is connected with the film formation chamber (B) 908 through a gate (not shown) as in the case of the alignment chamber 905. Specifically, the cleaning auxiliary chamber 922c has the same structure as the cleaning auxiliary chamber 922a. When a radical produced in the cleaning auxiliary chamber 922c is introduced into the film formation chamber (B) 908, the organic compound and the like which are deposited in the inner portion of the film formation chamber (B) 908 can be removed.

Next, reference numeral 910 denotes a film formation chamber for forming a third organic compound film by an evaporation method, called a film formation chamber (C). The film formation chamber (C) 910 is connected with the transfer chamber 901 through a gate 900e. In this embodiment, a film formation chamber with the structure shown in FIGS. 2A and 2B is provided as the film formation chamber (C) 910. In this embodiment, an organic compound film for light emission of blue color is formed in a film formation portion 911 inside the film formation chamber (C) 910.

Inside the film formation chamber (C) 910 there are set a plurality of evaporation sources, specifically, a first evaporation source including an organic compound with a hole injection property, a second evaporation source including the organic compound with a light emitting property, a third evaporation source including an organic compound with a blocking property, and a forth evaporation source including an organic compound with an electron transport property.

When these organic compounds are vapor-deposited in order, the organic compound film comprising regions with functions of the hole injection property, the light emitting property, the blocking property, and the electron transport property can be formed on the anode.

Also, in this embodiment, in order to form a mixed region in an interface between different functional regions, both organic compounds for forming adjacent functional regions are simultaneously vapor-deposited. That is, mixed regions are formed respectively in an interface between a hole injection region and a light emitting region, an interface between the light emitting region and a blocking region, and an interface between the blocking region and an electron transport region.

Note that the case %% here four kinds of organic compounds having different functions are included in four evaporation sources, respectively, and these organic compounds are vapor-deposited in order to form an organic compound film as the third organic compound film has been described above. However, the present invention is not limited to the above case, as far as plural kinds of organic compounds are used. Also, one evaporation source does not necessarily include one kind of organic compound and may include plural kinds of organic compounds. For example, an evaporation source may include another organic compound which is able to be a dopant in addition to one kind of material included as the organic compound with the light emitting property. The organic compounds indicated in Embodiment 1 can be used as organic compounds for forming the organic compound film which has the above plurality of functions and indicates light emission of blue color. A free combination of known materials may be also used.

The film formation chamber (C) 910 is connected with a material exchange chamber 916 through a gate 900i. Note that a heater for heating exchanged organic compounds is provided in the material exchange chamber 916. When the organic compounds are heated in advance, an impurity such as water can be removed. A heating temperature at this time is preferably 200° C. or lower. Also, an exhaust pump capable of making the inner portion in a reduced pressure state is included in the material exchange chamber 916. Thus, after organic compounds are introduced from the outside thermal treatment is performed, the inner portion is made to be in a reduced pressure state. Then, when the material exchange chamber becomes the same pressure state as the inside of the film formation chamber, the gate 900i is opened. Therefore, the organic compounds can be set in the evaporation sources inside the film formation chamber. Note that the organic compounds are set in the evaporation sources of the film formation chamber by the transfer mechanism or the like.

Note that, with respect to a film formation processing the film formation chamber (C) 910, the description of FIGS. 2A and 2B may be referred to.

A cleaning auxiliary chamber 922d is connected with the film formation chamber (C) 910 through a gate (not shown) as in the case of the alignment chamber 905. Specifically, the cleaning, auxiliary chamber 922d has the same structure as the cleaning auxiliary chamber 922a. When a radical produced in the cleaning auxiliary chamber 922d is introduced into the film formation chamber (C) 910, the organic compound and the like which are deposited inside the film formation chamber (C) 910 can be removed.

Next, reference numeral 912 denotes a film formation chamber for forming an conductive film (metallic film as the cathode in this embodiment) as the anode or the cathode of a light emitting element by an evaporation method, called a film formation chamber (D). The film formation chamber (D) 912 is connected with the transfer chamber 901 through a gate 900f. In this embodiment, an Al—Li alloy film (alloy film of aluminum and lithium) is formed as a conductive film, which is to be the cathode of the light emitting element, in the film formation portion 913 of the film formation chamber (D) 912. Note that an element which belongs to group 1 or group 2 of the periodic table and aluminum may be vapor-deposited together. The coevaporation is an evaporation method of simultaneously heating evaporation sources to mix different materials at a film formation stage.

The film formation chamber (D) 912 is connected with a material exchange chamber 917 through a gate 900j. Note that a heater for heating exchanged conductive materials is provided in the material exchange chamber 917. When the conductive materials are heated in advance, an impurity such as water can be removed. A heating temperature at this time is preferably 200° C. or lower. Also, an exhaust pump capable of making the inner portion in a reduced pressure state is included in the material exchange chamber 917. Thus, after conductive materials are introduced from the outside, the inner portion is made to be in a reduced pressure state. Then, when the material exchange chamber becomes the same pressure state as the inside of the film formation chamber, the gate 900j is opened. Therefore, the conductive materials can be set in the evaporation sources inside the film formation chamber.

A cleaning auxiliary chamber 922e is connected with the film formation chamber (D) 912 through a gate (not shown) as in the case of the alignment chamber 905. Concretely, the cleaning auxiliary chamber 922e has the same structure as the cleaning auxiliary chamber 922a. When a radical produced in the cleaning auxiliary chamber 922e is introduced into the film formation chamber (D) 912, the conductive material and the like which are deposited inside the film formation chamber (D) 912 can be removed.

In the film formation chamber (A) 906, the film formation chamber (B) 908, the film formation chamber (C) 910, and the film formation chamber (D) 912, mechanisms for heating the inner portions of the respective film formation chambers are provided. Thus, an impurity such as water in the film formation chambers can be removed.

As an exhaust pump included in the above respective film formation chambers, a dry pump, a mechanical booster pump, a turbo molecular pump (magnetic levitation type), a cryopump, or the like can be used. In this embodiment, a cryopump and a dry pump are desirably used.

A pressure in each of the film formation chamber (A) 906, the film formation chamber (B) 908, the film formation chamber (C) 910, and the film formation chamber (D) 912 are reduced by exhaust pumps. At this time, the degree of vacuum to be reached is desirably $10^{-6}$ Pa or more. For example, when a cryopump with an exhaust rate of 36000 l/s ($H_2O$) is used and a surface area of the inner portion of the film formation chamber is 1.5 $m^2$, the inner portion of the film formation chamber is preferably made of a material such as 18-8 stainless steel With a leak rate of $9.3 \times 10^{-7}$ $Pa \cdot m^3 \cdot s^{-1}$ or less. In order to obtain such a degree of vacuum, it is effective that the surface area of the inner portion of the film formation chamber is reduced by electropolishing because absorption of an impurity such as oxygen or water can be decreased.

In addition, a material such as aluminum which is mirror-finished by electropolishing is used for the inner wall surface. Also, an inner member made of a material such as ceramics which is processed so as to extremely have fewer pores is used. These materials have a surface evenness that an average surface roughness is 5 nm or less (preferably, 3 nm or less). The average surface roughness as described here is a roughness that a center line average roughness as defined by JIS B0601 is three-dimensionally extended for application to a surface.

In addition, there is also a method of forming an active surface on the inner wall oft the film formation chamber using a material which is easy to react with a gas, Ti, Zr, Nb, Ta, Cr, Mo, W, La, Ba, or the like may be used as a material in this case.

Next, reference numeral 918 denotes a sealing chamber (also referred to as a filling chamber or a glove box), which is connected with the load chamber 904 through a gate 900k. In the sealing chamber 918, processing for finally enclosing the light emitting element in a hermetic space is performed. This processing is for protecting the formed light emitting element from oxygen and moisture. Thus, means of performing mechanical sealing using a cover member, or sealing using a heat curable resin or an ultraviolet light curable resin is used.

Glass, ceramics, plastic, or metal can be used for the cover member. However, when light is emitted to the cover member side, it is required that the cover member be transparent. The cover member is bonded to the substrate on which the above light emitting element is formed by using a seal agent made of heat curable resin, ultraviolet light curable resin, or the like and then the resin is cured by thermal treatment or ultraviolet light irradiation processing to produce the hermetic space. It is also effective to provide a moisture absorption agent represented by barium oxide in the hermetic space.

A space between the cover member and the substrate on which the light emitting element is formed can be filled with heat curable resin or ultraviolet light curable resin. In this case, it is effective to add a moisture absorption agent represented by barium oxide into heat curable resin or ultraviolet light curable resin.

In the film formation apparatus shown in FIGS. 9A and 9B, a mechanism 919 for irradiating ultraviolet light into the inner portion of the sealing chamber 9118 (hereinafter referred to as an ultraviolet light irradiation mechanism) is provided and ultraviolet light curable resin is cured with ultraviolet light emitted from the ultraviolet light irradiation mechanism 919. Further, the inner portion of the sealing chamber 918 can be made to be in a reduced pressure state by attaching an exhaust pump. When the above sealing step is mechanically performed by robot operation under a reduced pressure state, mixing of oxygen and moisture can be prevented. Note that, specifically, the concentration of oxygen and water is desirably 0.3 ppm or lower. On the other hand, the inner portion of the sealing chamber 918 can be made to be in a pressurized state. In this case, purging is performed using a nitrogen gas or a noble gas with high purity to make a pressurized state. Thus, intrusion of oxygen and the like from the outside are prevented.

Next, a passing chamber (pass box) 920 is connected with the sealing chamber 918. A transfer mechanism (B) 921 is provided in the passing chamber 920 and the substrate in which sealing of the light emitting element is completed in the sealing chamber 918 is transferred to the passing chamber 920. The passing chamber 920 can be also made to be in a reduced pressure state by attaching an exhaust pump. The passing chamber 920 is a facility in order not to directly expose the sealing chamber 918 to outside air and the substrate is taken out therefrom. In addition, a member supply chamber (not shown) for supplying a member used in the sealing chamber can be provided.

Note that, although not shown in this embodiment, after formation of the light emitting element, a compound containing silicon such as silicon nitride or silicon oxide, or an insulating film in which a DLC (diamond like carbon) film containing carbon is laminated on the above compound may be formed on the light emitting element. The DLC (diamond like carbon) film is an amorphous film in which diamond bond (sp$^3$ bond) and graphite bond (SP$^2$ bond) are mixed. In this case, a film formation chamber including a CVD (chemical vapor deposition) apparatus, in which a self bias is applied to generate plasma and to form a thin film by plasma discharge decomposition of a raw material gas, is preferably provided.

Note that oxygen ($O_2$), hydrogen ($H_2$), methane ($CH_4$), ammonia ($NH_3$), or silane ($SiH_4$) can be used in the film formation chamber including the CVD (chemical vapor deposition) apparatus. Also, a CVD apparatus which has parallel plate electrodes and an RF power source of 13.56 MHZ is preferably used.

Further, a film formation chamber for performing film formation by a sputtering method (also referred to as a sputter method) can be provided since film formation by sputtering is effective in the case where the anode is formed after the organic compound film is formed on the cathode of the light emitting element. That is, it is effective in the case where a pixel electrode is the cathode. Note that, when the inner portion of the film formation chamber at film formation is made to be in an atmosphere in which oxygen is added into argon, an oxygen concentration in a formed film can be controlled and thus a film having a high transmittance and a low resistance can be formed. Also, as in the case of other film formation chambers, the film formation chamber is desirably isolated from the transfer chamber by the gate.

In the film formation chamber for performing sputtering, a mechanism for controlling a temperature of a substrate on which a film is to be formed may be provided. The substrate is desirably kept at 20 to 150° C. As an exhaust pump included in the film formation chamber, a dry pump, a mechanical booster pump, a turbo molecular pump (magnetic levitation type), a cryopump, or the like can be used. In this embodiment, the cryopump and the dry pump is desirable.

Figure 9B:
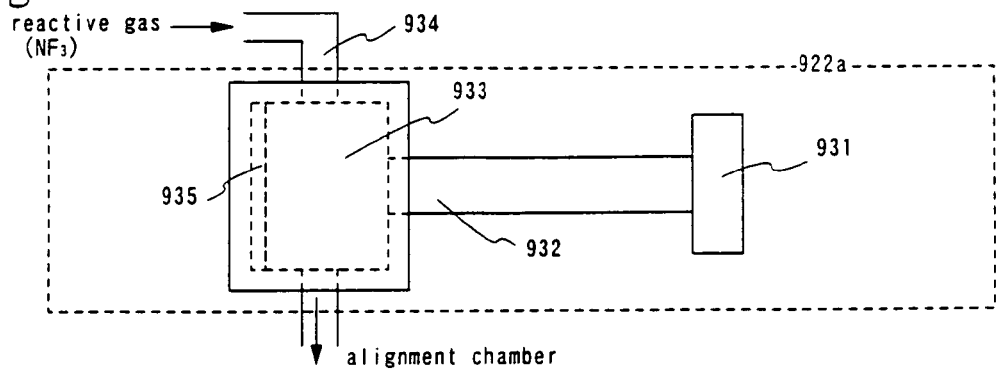

As described above, when the film formation apparatus shown in FIGS. 9A and 9B is used, the light emitting element is completely enclosed in the hermetic space without exposure to outside air. Thus, a light emitting device having high reliability can be manufactured.

Embodiment 3

In this embodiment, a film formation apparatus, in which a transfer method of a substrate and structures of film formation chambers are different from the in-line type film formation apparatus described in Embodiment 1, will be described using FIGS. 10A and 10B.

In FIGS. 10A and 10B, a substrate 1004 set in a load chamber 1000 is transferred to a first alignment unit 1001 connected therewith through a gate (not shown). Note that the substrate 1004 is aligned by the method described using FIGS. 5A to 5E and held in a holder 1002 together with a metallic mask 1003.

Then, the substrate 1004 is transferred together with the holder 1002 to a first film formation unit 1005. The first alignment unit 1001 is connected with the first film formation unit 1005 without a gate to produce the same space. Thus, in this embodiment, rails 1012 are provided as means capable of freely moving the holder 1002 between the first alignment unit 1001 and the first film formation unit 1005, and the holder 1002 is moved on the rails 1012 and respective processings are performed. Note that processing positions at the time of alignment and film formation are controlled by a control mechanism included in the holder 1002.

Then, in the first film formation unit 1005, evaporation is performed with a plurality of evaporation sources 1006 including different organic compounds respectively to form a first organic compound film. Note that, the above moving means is also used in the case while the holder is transferred to a second alignment unit 1007 and a second film information unit 1008 in order to form a second organic compound film.

Further, when a third organic compound film is formed, the holder is transferred to a third alignment unit 1009 and a third film formation unit 1010 in the same manner.

As described above, in this embodiment, three kinds of organic compound films can be formed in the same space. The third film formation unit 1010 is connected with an unload chamber 1011 through a gate (note shown) and the substrate after film formation can be taken out.

Note that, a processing method in the alignment units and the film formation units in this embodiment is preferably subjected to the processing in the alignment chambers and the film formation chambers in Embodiment 1.

Also, when a wall for isolating the alignment unit and the film formation to an extent not to hinder transfer of the substrate, is provided therebetween in this embodiment, it can prevent the organic compounds, which are flown from the evaporation sources at the time of film formation, from flowing to units (the alignment unit and other film formation units) outside the film formation unit.

Also, even in the case of the film formation apparatus of this embodiment, a cleaning auxiliary chamber 1013 is preferably provided to clean the inner portion of the film formation chamber and the metallic mask.

When the plurality of organic compound films are formed in the same space using the film formation apparatus described above, movement in forming different organic compound films becomes easy. Thus, a processing time can be shortened.

Also, according to the film formation apparatus described in this embodiment, evaporations are continuously performed in the film formation chamber and thus three kinds of organic compound films each including a plurality of functions can be formed on the substrate on which the anode or the cathode of a light emitting element has been formed. A film formation chamber for forming a conductive film is further provided in order to continuously perform formation of the cathode or the anode of the light emitting element. Note that, in addition to an Al—Li alloy film (alloy film of aluminum and lithium), a film obtained by vapor-depositing together an element which belongs to group 1 or group 2 of the periodic table with aluminum is preferable used as the conductive film in the case where the cathode is formed. Also, when the anode is formed, indium oxide, tin oxide, zinc oxide, or a compound thereof (ITO or the like) is preferably used.

In addition, a processing chamber for sealing the manufactured light emitting element can be provided.

Also, in the film formation apparatus of this embodiment, the exhaust pump as described in Embodiment 1 or 2 can be located. In order to keep a pressure in the film formation chamber constant, a single pump or a plurality of pumps, each having the same kind and the same evaporation capacity, are preferably provided. Note that a combination of a dry pump and a cryopump is preferably used.

Embodiment 4

Figure 11:
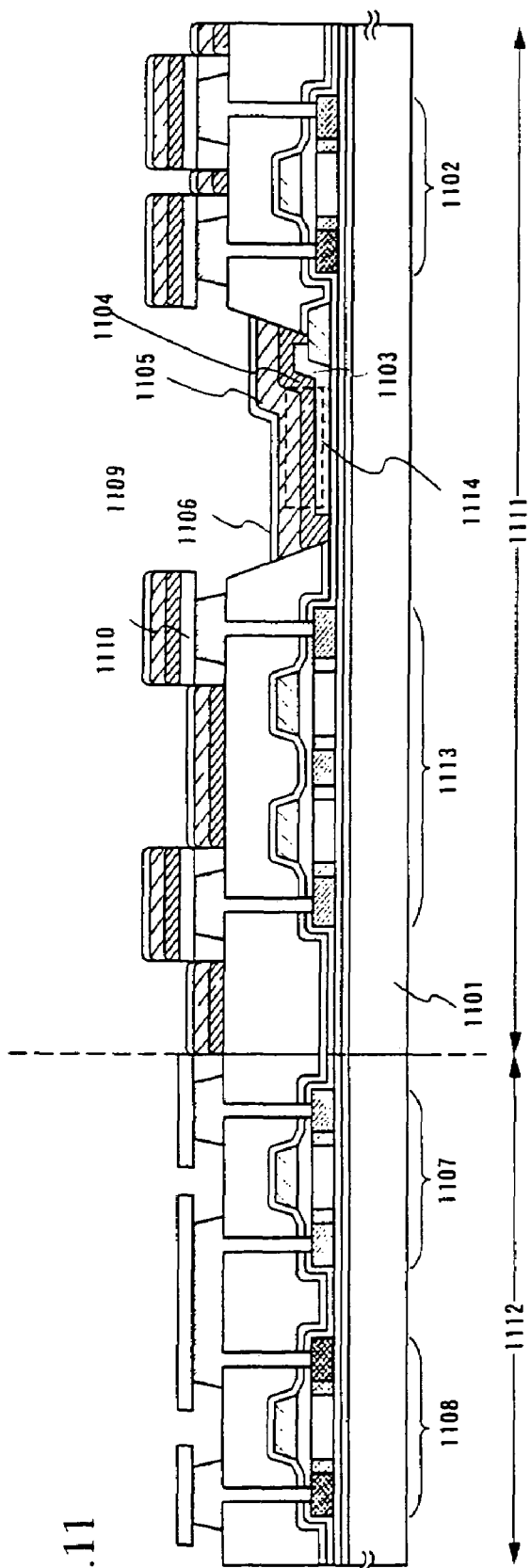
FIG. 11 is an explanatory view of a light emitting device.

In this embodiment, a light emitting device manufactured using the film formation apparatus of the present invention will be described. FIG. 11 is a cross sectional view of an active matrix light emitting device. Note that, although a thin film transistor (hereinafter referred to as a "TFT") is used here as an active element, an MOS transistor may also be used.

Also, a top gate TFT (specifically, a planar TFT) is indicated as an example of the TFT. However, a bottom gate TFT (typically, an inverse staggered TFT) can be also used.

In FIG. 11, reference numeral 1101 denotes a substrate. A substrate which transmits visible light is used here. Specifically, a glass substrate, a quartz substrate, a crystallized class substrate, or a plastic substrate (including a plastic film) is preferably used. Note that the substrate 1101 includes an insulating film provided on the surface.

A pixel portion 1111 and a driver circuit 1112 are provided on the substrate 1101. First, the pixel portion 1111 will be described.

The pixel portion 1111 is a region for image display. A plurality of pixels are present on the substrate. A TFT (hereinafter referred to as "a current control TFT") 1102 for controlling a current flowing into a light emitting element, a pixel electrode (anode) 1103, an organic compound film 1104, and a cathode 1105 are provided in each of the pixels. Note that reference numeral 1113 denotes a TFT (hereinafter referred to as "a switching TFT") for controlling a voltage applied to the gate of the current control TFT.

Here, a p-channel TFT is preferably used as the current control TFT 1102. Although an n-channel TFT can be also used, use of the p-channel TFT provides more effective reduction in power consumption in the case where the current control TFT is connected with the anode of the light emitting element as shown in FIG. 11. Note that the switching TFT 1113 may be either an n-channel TFT or a p-channel TFT.

Also, the pixel electrode 1103 is electrically connected with the drain of the current control TFT 1102. In this embodiment, a conductive material with a work function of 4.5 to 5.5 eV is used as a material of the pixel electrode 1103. Thus, the pixel electrode 1103 functions as the anode of the light emitting element. As the pixel electrode 1103, typically, indium oxide, tin oxide, zinc oxide, or a compound thereof (ITO or the like) is preferably used. The organic compound film 1104 is provided on the pixel electrode 1103.

Further, a cathode 1105 is provided on the organic compound film 1104. A conductive material with a work function of 2.5 to 3.5 eV is desirably used as a material of the cathode 1105. As the cathode 1105, typically, a conductive film including an alkali metal element or an alkali earth metal element, a conductive film including aluminum, or a film obtained by laminating aluminum, silver, or the like on the conductive film is preferably used.

Also, a light emitting element 1114 composed of the pixel electrode 1103, the organic compound film 1104, and the cathode 1105 is covered with a protective film 1106. The protective film 1106 is provided to protect the light emitting element 114 from oxygen and water. As a material of the protective film 1106, silicon nitride, silicon oxynitride, aluminum oxide, tantalum oxide, or carbon (specifically, diamond-like carbon) is used.

Next, the driver circuit 1112 will be described. The driver circuit 1112 is a region for controlling timing of signals (gate signal and data signal) transmitted to the pixel portion 1111, and a shift register, a buffer, a latch, an analog switch (transfer gate), or a level shifter is provided therein. In FIG. 11, a CMOS circuit composed of an n-channel TFT 1107 and a p-channel TFT 1108 is indicated as a basic unit of these circuits.

Note that a circuit structure of the shift register, the buffer, the latch, the analog switch (transfer gate), or the level shifter may be a known structure. Also, in FIG. 11, the pixel portion 1111 and the driver circuit 1112 are provided on the same substrate. However, an IC or an LSI can be electrically connected with the pixel portion without providing the driver circuit 1112.

Also, in FIG. 11, the pixel electrode (anode) 1103 is electrically connected with the current control TFT 1102. However, a structure in which the cathode is connected with the current control TFT can be also used. In this case, the pixel electrode 1103 is preferably made of the same material as the cathode 1105 and the cathode is preferably made of the same material as the pixel electrode (anode) 1103. In this case, the current control TFT is preferably an n-channel TFT.

Also, in this embodiment, a shape with a canopy (hereinafter called a canopy structure) composed of a wiring 1109 and an isolation portion 1110 is provided. The canopy structure composed of the wiring 1109 and an isolation portion 1110 as shown in FIG. 11 can be formed by laminating metal composing the wiring 1109 and a material (for example, metal nitride) which composes the isolation portion 1110 and has a lower etching rate than the metal, and then etching them. With this shape, a short circuit between the pixel electrode 1103 or the wiring 1109, and the cathode 1105 can be prevented. Note that, in this embodiment, unlike in a common active matrix light emitting device, the cathode 1105 on a pixel is formed in a stripe shape (as in the case of the cathode in a passive matrix type).

Figure 12A:
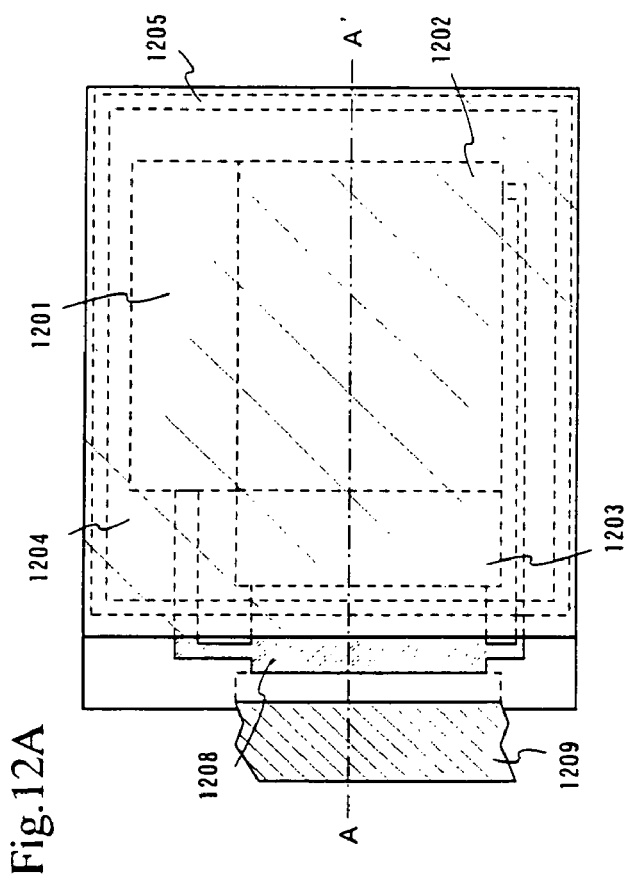
FIGS. 12A and 12B are explanatory views of a sealing structure.
Figure 12B:
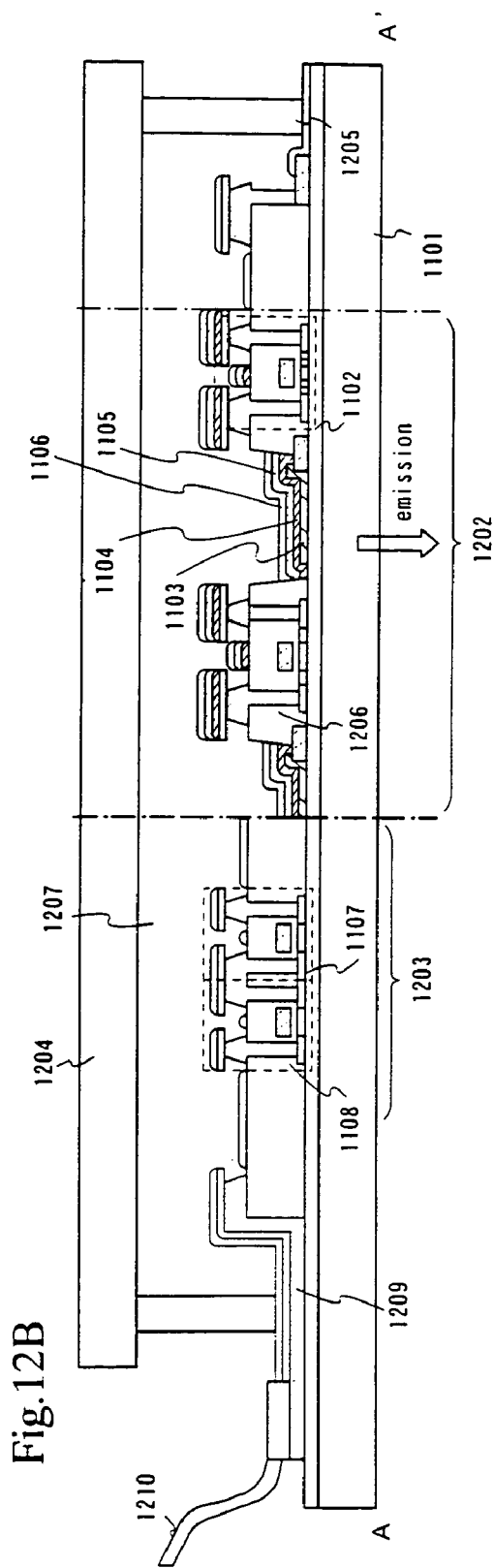

Here, an appearance of the active matrix light emitting device shown in FIG. 11 is shown in FIGS. 12A and 12B. Note that FIG. 12A is a top view and FIG. 12B is a cross sectional view obtained by cutting FIG. 12A along a line A-A'. In addition, reference numerals used in FIG. 11 are also used here.

Reference numerals 1201, 1202, and 1203, each indicated by a dotted line, denote a source side driver circuit, a pixel portion, and a gate side driver circuit, respectively. Reference numeral 1204 denotes a cover member and 1205 denotes a seal agent. A space 1207 is produced in an inside region surrounded by the seal agent 1205.

Note that reference numeral 1208 denotes a wiring for transmitting signals to be inputted to the source side driver circuit 1201 and the gate side driver circuit 1203. This wiring receives a video signal and a clock signal from an FPC (flexible printed circuit) 1210 as an external input terminal. Although only the FPC is shown here, a printed wiring board (PWB) may be attached to the FPC. The light emitting device in this specification includes not only a light emitting module in which the FPC or PWB is attached to a light emitting panel, but also a light emitting module in which an IC is mounted.

Next, a cross sectional structure will be described using FIG. 12B. The pixel portion 1202 and the gate side driver circuit 1203 are formed over the substrate 1101. The pixel portion 1202 is composed of a plurality of pixels each including the current control TFT 1102 and the pixel electrode 1103 electrically connected with the drain thereof. The gate side driver circuit 1203 is composed of a CMOS circuit in which the n-channel TFT 1107 and the p-channel TFT 1108 are combined with each other.

The pixel electrode 1103 functions as the anode of the light emitting element. An interlayer insulating film 1206 is formed in both ends of the pixel electrode 1103. The organic compound film 1104 and the cathode 1105 of the light emitting element are formed on the pixel electrode 1103.

The cathode 1105 also functions as a wiring common to the plurality of pixels and electrically connected with the FPC 1210 through a connection wiring 1209. All elements which are included in the pixel portion 1202 and the gate side driver circuit 1203 are covered with the protective film 1106.

Also, the cover member 1204 is bonded to the substrate through the seal agent 1205. Note that a spacer made of a resin film may be provided to keep an interval between the cover member 1204 and the light emitting element. A hermetic space is produced inside the seal agent 1205, which is filled with an inert gas such as nitrogen or argon. It is also effective to provide a moisture absorption agent represented by barium oxide in this hermetic space.

Also, glass, ceramics, plastic, or metal can be used for the cover member. When light is emitted to the cover member side, it is required that the cover member is transparent. Note that FRP (fiberglass-reinforced plastics), PVF (polyvinylfuroride), Mylar, polyester, or acrylic can be used as plastic.

Thus, when the light emitting element 1104 formed on the substrate is enclosed using the cover member 1204 and the seal agent 1205, it is can be completely shut off from the outside and intrusion of a substance from the outside such as water or oxygen. Which prompts deterioration of the organic compound layer by inducing oxidation thereof, can be prevented. Therefore, the light emitting device having high reliability can be obtained.

Note that the light emitting device of this embodiment can be formed using the film formation apparatus described in Embodiments 1 to 3.

Embodiment 5

Figure 13:
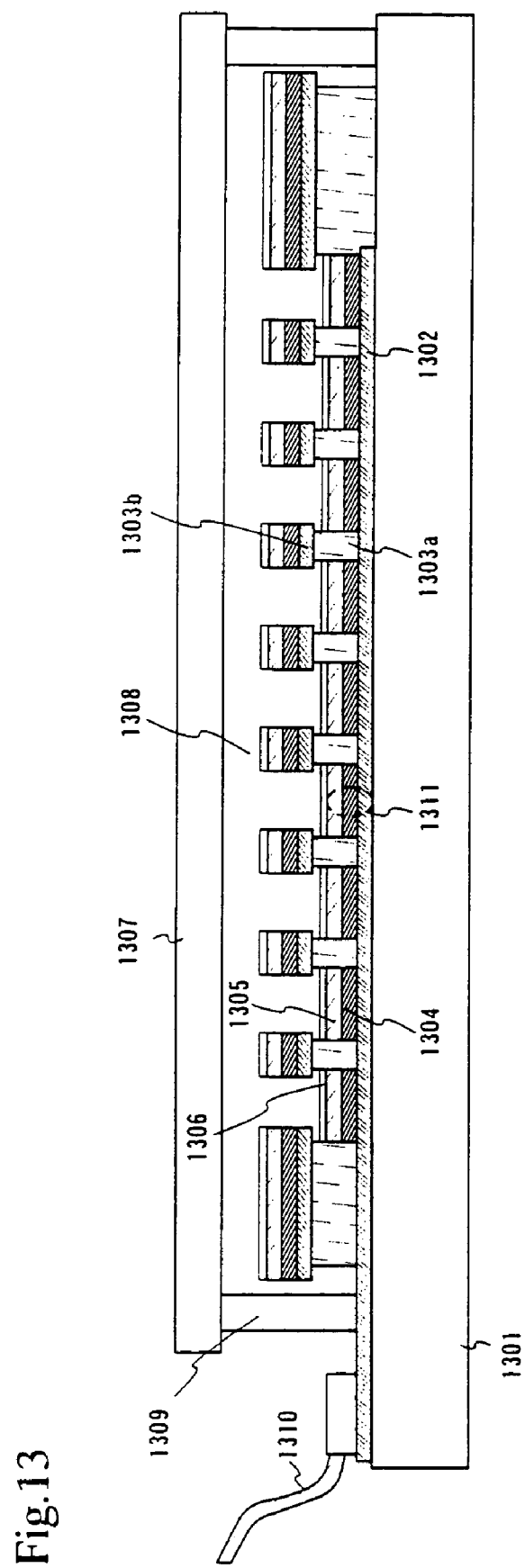
FIG. 13 is an explanatory view of the light emitting device.

In this embodiment, a passive (simple matrix) light emitting device manufactured using the film formation apparatus of the present invention will be described. FIG. 13 is used for the description. In FIG. 13, reference numeral 1301 denotes a glass substrate and 1302 denotes an anode made from a transparent conductive film. In this embodiment, a compound of indium oxide and zinc oxide is formed as the transparent conductive film by an evaporation method. Note that, although not shown in FIG. 13, a plurality of anodes are arranged in a stripe fashion in a direction parallel to a paper surface Cathode isolation walls (1303*a* and 1303*b*) are formed so as to intersect the anodes 1302 arranged in a stripe fashion. The cathode isolation walls (1303*a* and 1303*b*) are formed in the direction vertical to the paper surface.

Then, an organic compound film 1304 is formed. With respect to the organic compound film formed here, a plurality of functional regions are preferably formed by combining a plurality of organic compounds each having a function of a hole injection property, a hole transport property, a light emitting property, a blocking property, an electron transport property, or an electron injection property.

Note that a mixed region is also formed between the functional regions in this embodiment. When forming the mixed region, the method described in the section of the embodiment mode is preferably used.

These organic compound films are formed along grooves produced by the cathode isolation walls (1303*a* and 1303*b*) and are thus arranged in a stripe in the direction vertical to the paper surface.

After that, a plurality of cathodes 1305 are arranged in a stripe such that the direction vertical to the paper surface becomes a longitudinal direction and they intersect the anodes 1302. Note that in this embodiment, the cathodes 1305 are made of MgAg and formed by an evaporation method. Also, although not shown, with respect to the cathodes 1305, a wiring is extended up to a portion to which the FPC is attached later so as to apply a predetermined voltage. Further, after the cathodes 1305 are formed, a silicon nitride film is provided as a protective film 1306.

Thus, a light emitting element 1311 is formed on the substrate 1301. Note that, since the lower side electrode is the translucent anode in this embodiment, light produced in the organic compound film is emitted to a lower surface (the substrate 1301). However, the structure of the light emitting element 1311 may be reversed so that the lower side electrode can be also used as a light shielding cathode. In this case, light produced in the organic compound film is emitted to an upper surface (side opposite to the substrate 1301).

Next, a ceramics substrate is prepared as a cover member 1307. According to the structure of this embodiment, the ceramics substrate is used so that the cover member 1307 has a light shielding property. Of course, when the structure of the light emitting element is reversed as described above, the cover member is preferably translucent. Thus, a substrate made of plastic or glass is preferably used.

Thus, the prepared cover member 1307 are bonded to the substrate through a seal agent 1309 made of an ultraviolet light curable resin. Note that a space 1308 produced inside the seal agent 1309 is a hermetic space and is filled with an inert gas such as nitrogen or argon. It is also effective to provide a moisture absorption member represented by barium oxide in this hermetic space 1308. Finally, an anisotropic conductive film (FPC) 1310 is attached to the resultant substrate to complete the passive light emitting device.

Note that the light emitting device described in this embodiment can be formed using any one of film formation apparatuses according to Embodiments 1 to 3.

Embodiment 6

Being self-luminous, a light emitting device using a light emitting element has better visibility in bright places and wider viewing angle than liquid crystal display devices. Therefore various electric appliances can be completed by using the light emitting device of the present invention.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 14A to 14H.

Figure 14A:
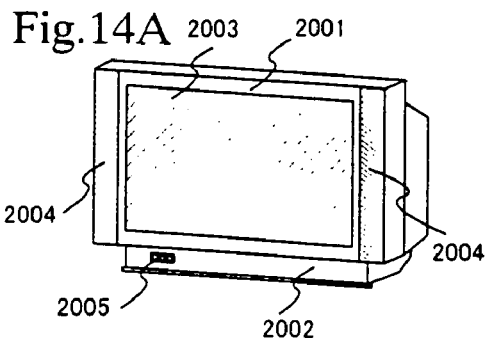
FIGS. 14A to 14H show examples of electrical devices.

FIG. 14A shows a display device, which is composed of a case 2001, a support base 2002, a display unit 2003, speaker units 2004, a video input terminal 2005, etc. The light emitting, device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 14B:
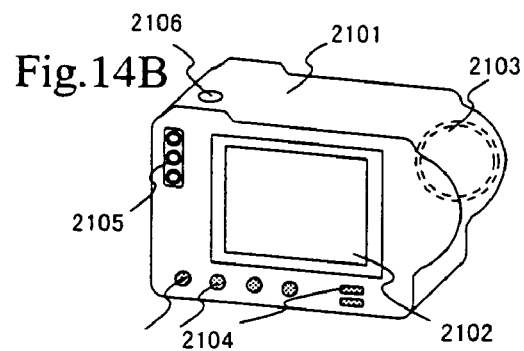

FIG. 14B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 14C:
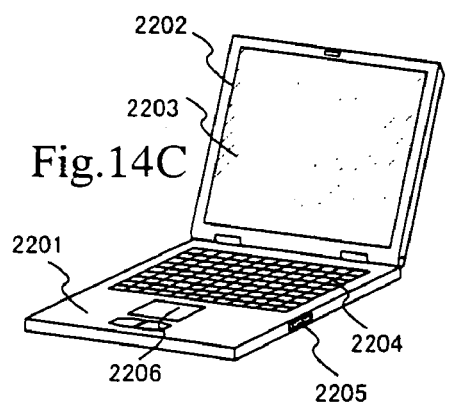

FIG. 14C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 14D:
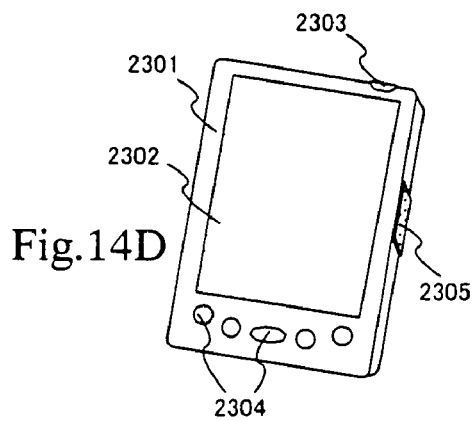

FIG. 14D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 14E:
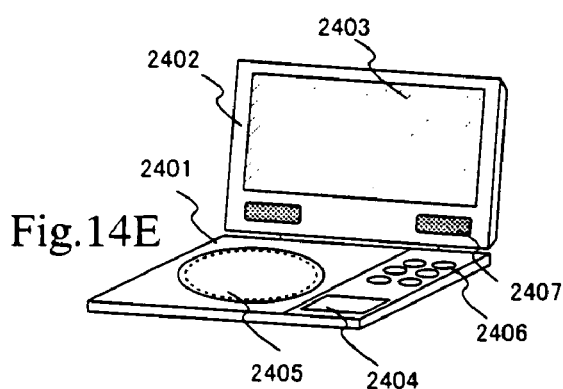

FIG. 14E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 14F:
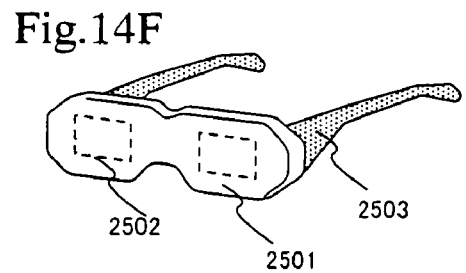

FIG. 14F shows a goggle type display (head mounted display), which is composed of a main body 2501, display units 2502, and arm units 2503. The light emitting device manufactured in accordance with the present invention can be applied to the display units 2502.

Figure 14G:
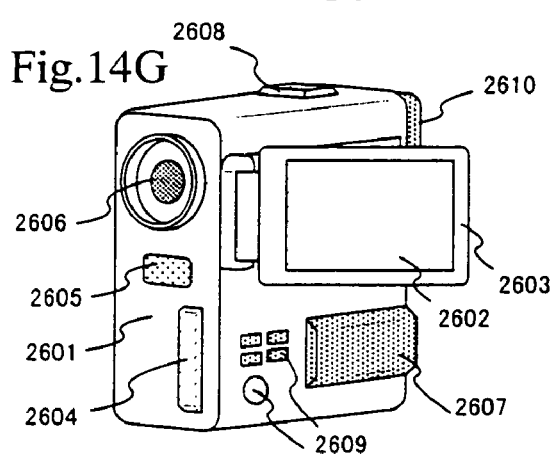

FIG. 14G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

Figure 14H:
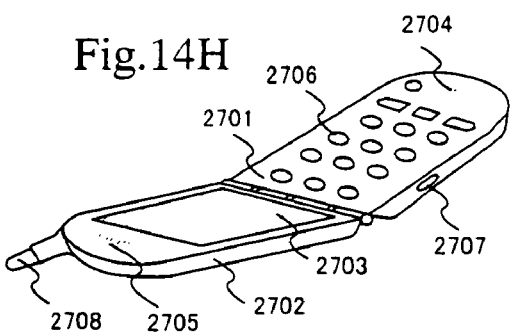
Figure 15:
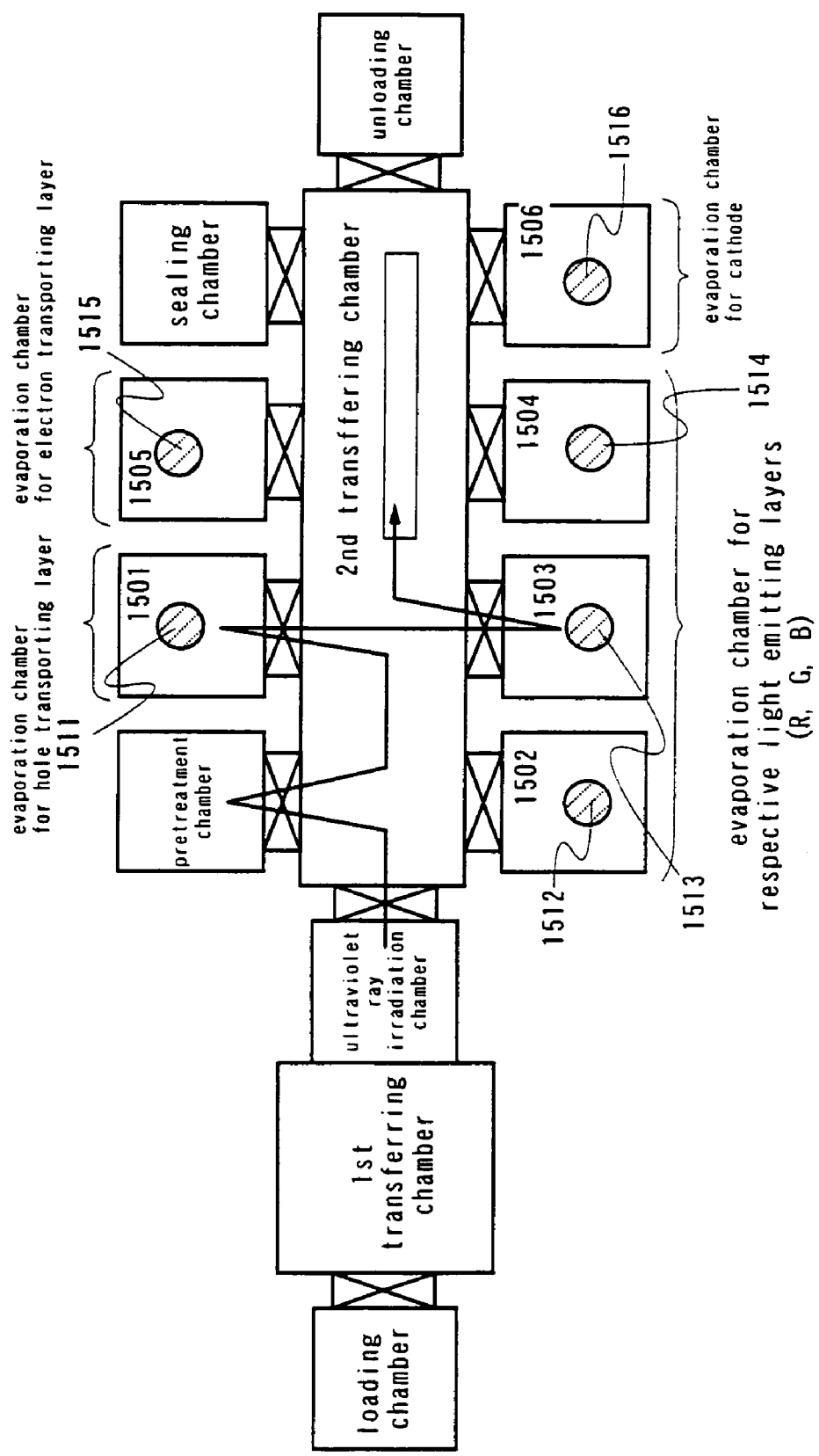
FIG. 15 is an explanatory view of a conventional example.
Figure 16A:
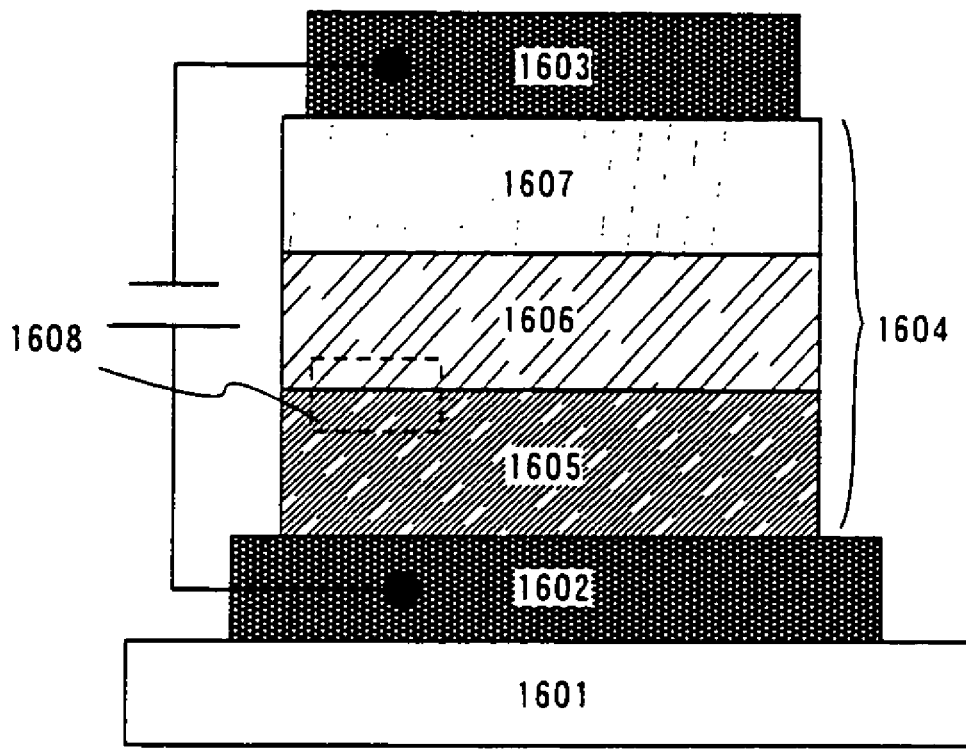
FIGS. 16A and 16B are explanatory views of a conventional example.
Figure 16B:
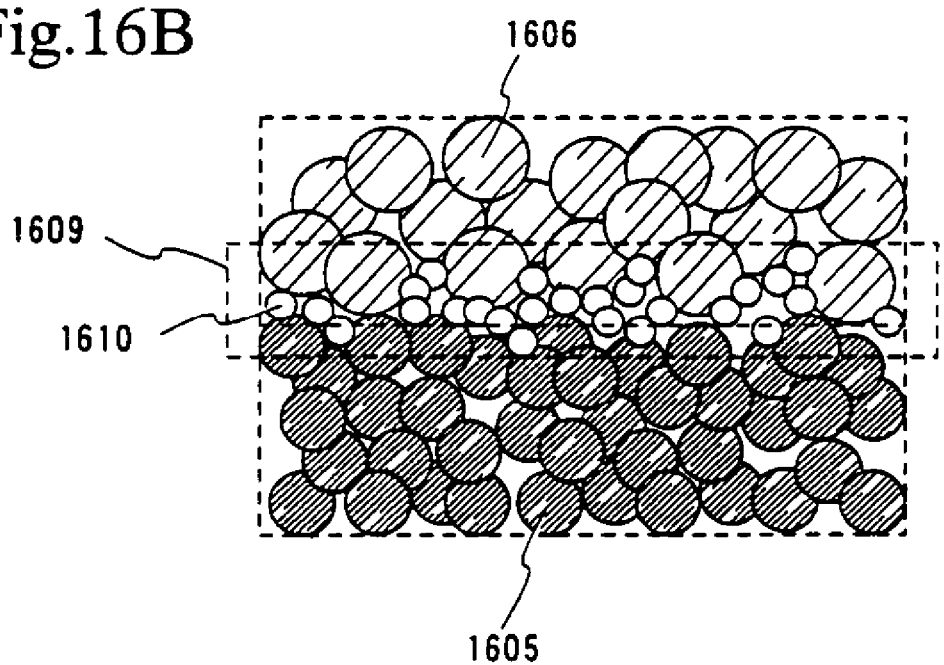

FIG. 14H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 27003 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can employ as their display units any light emitting device shown in Embodiments 4 or 5, which is formed by the deposition method shown in Embodiments 1 to 3.

Embodiment 7

In this embodiment, the pixel portion structure of the light emitting device formed by a deposition method of the present invention is described.

Figure 17A:
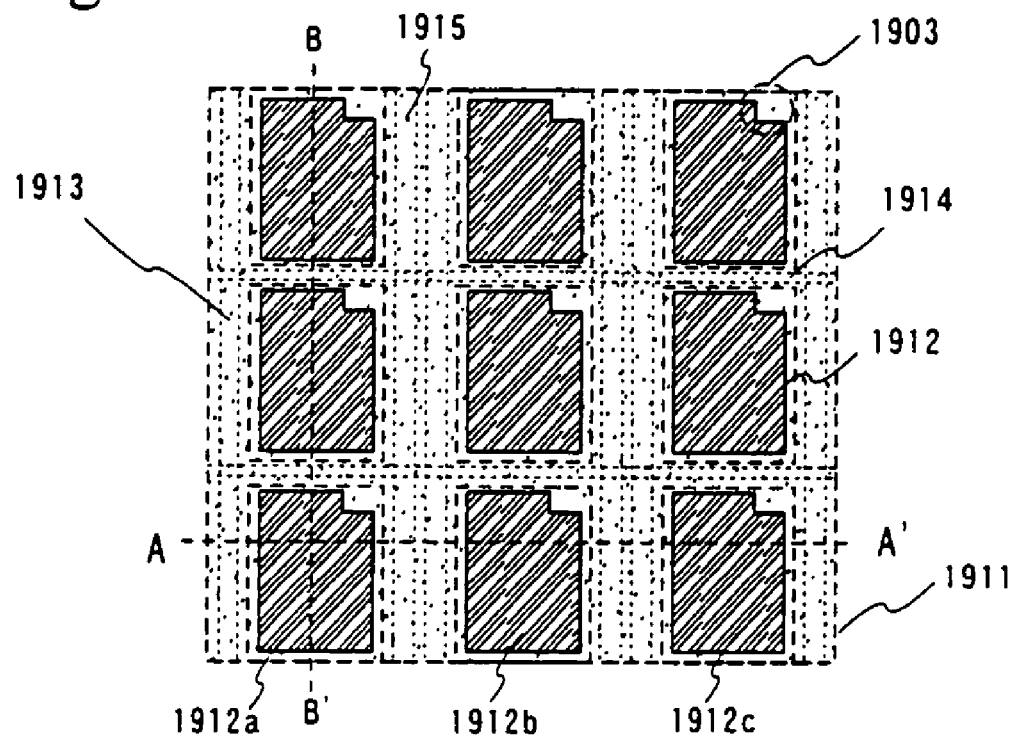
FIGS. 17A to 17C are explanatory views of a structure of a pixel portion in a light emitting device.

A part of the top surface view of the pixel portion 1911 is shown in FIG. 17A. A plural pixels 1912 are formed in the pixel portion 1911. The top surface view shows the state of the insulating layer 1902 formed to cover the edge portion of the pixel electrode formed in a pixel is shown. Thus, the insulating layer 1902 is formed to cover a source line 1913, a scanning line 1914 and a current supply line 1915. The insulating layer 1902 also covers the region a 1903 where connection portion of the pixel electrode and the TFT is formed at the bottom.

Figure 17B:
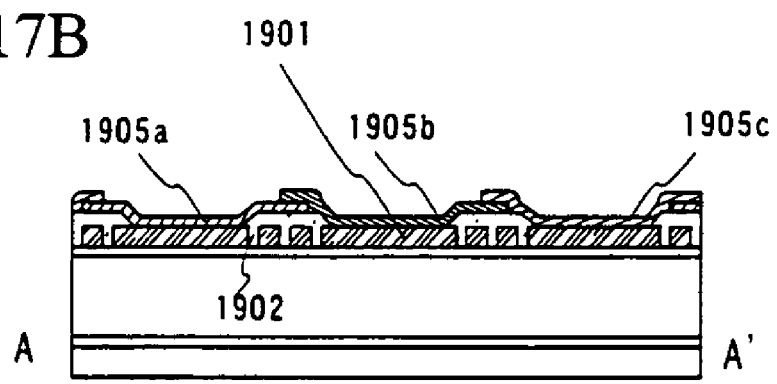

In addition, the state of FIG. 17B is a cross-section view taken along the dot line A-A' of the pixel portion 1911. The state of forming the organic compound film 1905 on the pixel electrode 1901 is shown in FIG. 17B. Further, the organic compound film composed by same material is formed for space in the vertical direction, and the organic compound film composed by different material is formed for space in the horizontal direction.

For example, the organic compound film (R) 1905a showing red emission is formed in the pixel (R) 1912a, the organic compound film (G) 1905b showing green emission is formed in the pixel (G) 1912b and the organic compound film (B) 1905c showing blue emission is formed in the pixel (B) 1912c, which are shown in FIG. 17A. The insulating film 1902 becomes a margin when the organic compound film is formed. There is no problem as long as being on the insulating film 1902 even if the deposition position of the organic compound film shifts somewhat and the organic compound film composed by different material comes in succession on the insulating film 1902.

In addition, a cross-section view taken along the dot line B-B' of the pixel portion 1911 shown in FIG. 17A. The state of forming the organic compound film 1905 on the pixel electrode 1901 as FIG. 17B is shown in FIG. 17C.

Figure 17C:
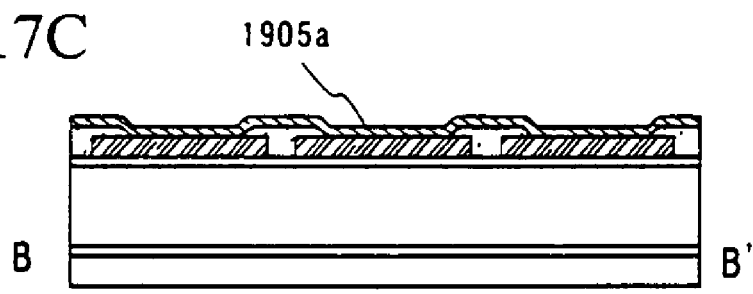
Figure 18:
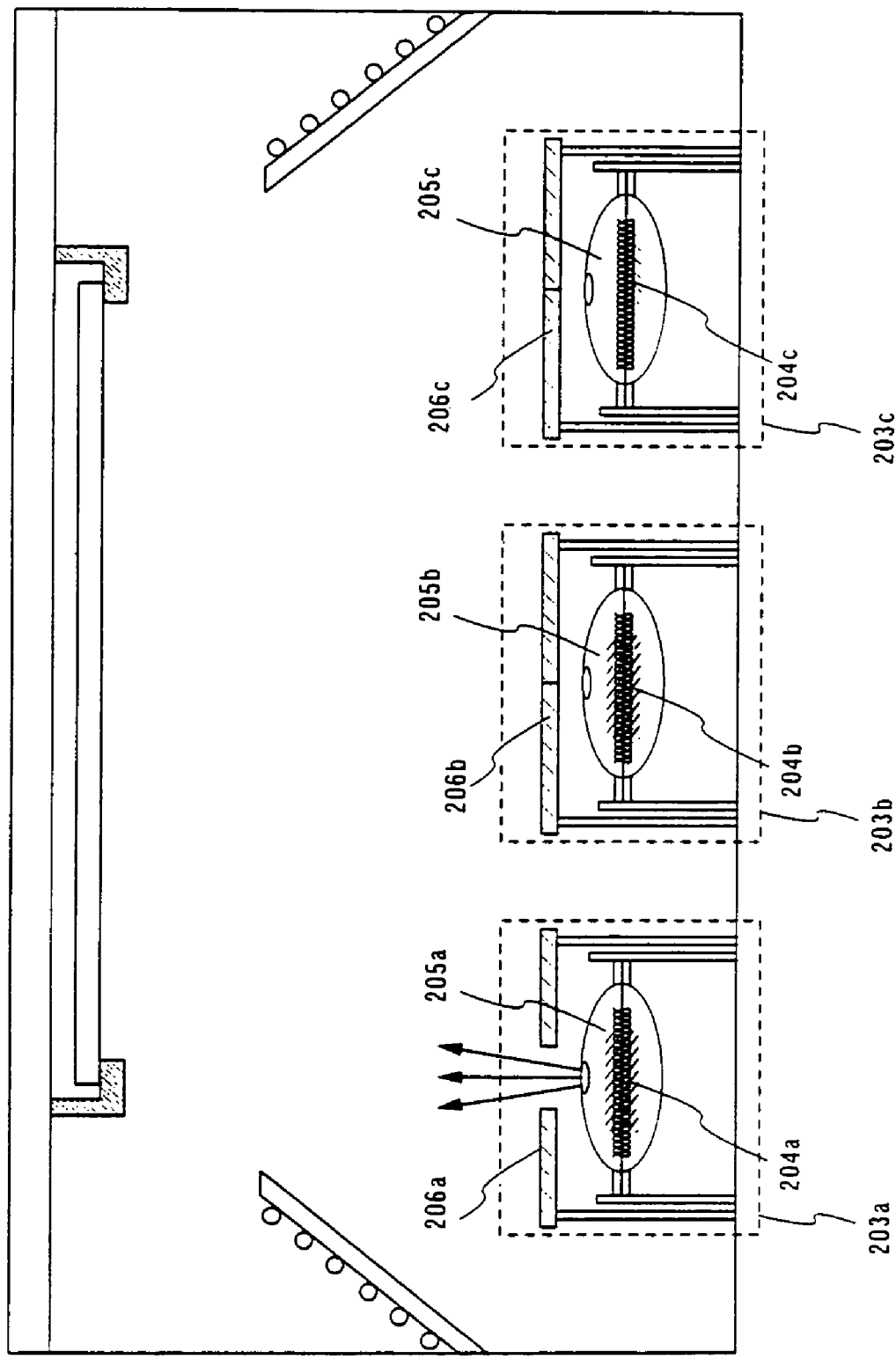
FIG. 18 is an explanatory view of a film formation chamber.

The pixel taken along the dot line B-B' have a structure shown in FIG. 17C, since the organic compound film (R) 1905a showing red emission as the pixel (R) 1912a is formed.

Therefore, the organic compound film (R) 1905a showing red emission, the organic compound film (G) 1905b showing green emission and the organic compound film (B) 1905c showing blue emission are formed in the pixel portion 1911. Thus, the full-color of the light emitting device can be realized.

As described above, when the organic compound film in the light emitting element is formed using the film formation apparatus of the present invention, since the organic compound film including the plurality of functional regions can be successively formed in the same film formation chamber, contamination of impurities in the interfaces between the functional regions can be prevented. Also, since the mixed region made of the organic compounds for forming the respective functional regions can be also formed between adjacent functional regions, an energy barrier produced between the organic compound layers in the interface between the functional regions can be relaxed. Thus, since a carrier injection property between the organic compound layers can be thus improved, the light emitting element having reduced drive voltage and a long element life can be formed. Further, when energy is applied from a light source provided in the film formation chamber to an organic compound molecule to be formed into a film, a dense film can be also formed.

What is claimed is:

1. A film formation method in a film formation chamber, comprising the step of:
    simultaneously evaporating a first organic compound from a first evaporation source and a second organic compound from a second evaporation source in the film formation chamber; and
    activating the first organic compound evaporated from the first evaporation source and the second organic compound evaporated from the second evaporation source by irradiation with light in the film formation chamber so that an organic film including the first organic compound and the second organic compound is formed over a substrate,
    wherein a surface of an inner wall of the film formation chamber is electrolytic-polished, and
    wherein the film formation chamber is connected with first exhaust means and second exhaust means.

2. A film formation method according to claim 1, wherein the first organic compound and the second organic compound are different from each other.

3. A film formation method according to claim 1, wherein the light is infrared light.

4. A film formation method in a film formation chamber, comprising the step of:
    simultaneously evaporating a first organic compound from a first evaporation source and a second organic compound from a second evaporation source in the film formation chamber; and
    activating the first organic compound evaporated from the first evaporation source and the second organic compound evaporated from the second evaporation source by irradiation with light so that an organic film including the first organic compound and the second organic compound is formed over a substrate,
    wherein a surface of an inner wall of the film formation chamber is electrolytic-polished and an average surface roughness of the surface of the inner wall is 5 nm or less, and
    wherein the film formation chamber is connected with a cryopump and a dry pump.

5. A film formation method according to claim 4, wherein the first organic compound and the second organic compound are different from each other.

6. A film formation method according to claim 4, wherein the light is infrared light.

7. A film formation method comprising the steps of:
    vapor-depositing a first plural kinds of organic compounds simultaneously and successively changing a concentration of each of the first plural kinds of organic compounds to form a first organic compound film in a first film formation chamber which includes a plurality of evaporation sources;
    vapor-depositing a second plural kinds of organic compounds simultaneously and successively changing a concentration of each of the second plural kinds of organic compounds to form a second organic compound film in a second film formation chamber which includes a plurality of evaporation sources; and
    vapor-depositing a third plural kinds of organic compounds simultaneously and successively changing a concentration of each of the third plural kinds of organic compounds to form a third organic compound film in a third film formation chamber which includes a plurality of evaporation sources, wherein the first organic compound film, the second organic compound film, and the third organic compound film exhibit light emission of different colors.

8. A film formation method according claim 7,
wherein the first plural kinds of organic compounds includes at least a first organic compound and a second organic compound, and
wherein, in the first film formation chamber, a first functional region comprising the first organic compound is formed and a second functional region comprising the second organic compound is formed.

9. A film formation method according to claim 8, wherein a mixed region comprising the first organic compound and the second organic compound is formed in an interface between the first functional region and the second functional region.

10. A film formation method according to of claim 8, wherein the first functional region comprises an organic compound with a hole transport property, and the second functional region comprises an organic compound with an electron transport property.

11. A film formation method according to claim 8, wherein a second mixed region comprising the second organic compound and a third organic compound is formed in a part of the second functional region.

12. A film formation method according to claim 11, wherein the third organic compound is an organic compound with a light emitting property, and the first, second, and third organic compounds are formed of different organic compounds.

13. A film formation method according to claim 8, wherein each of the first organic compound and the second organic compound is an organic compound comprising one of a hole injection property, a hole transport property, an emitting property, a blocking property, an electron transport property, and an electron injection property, and the first and second organic compounds are formed of different organic compounds.

14. A film formation method according to claim 13, wherein an aromatic diamine compound is used as the organic compound with the hole transport property.

15. A film formation method according to claim 13, wherein one of a metallic complex including quinoline skeleton, a metallic complex including benzoquinoline skeleton, an oxadiazole derivative, a triazole derivative, and a phenanthroline derivative is used as the organic compound with the electron transport property.

16. A film formation method according to claim 13, wherein a metallic complex including quinoline skeleton, a metallic complex including benzoxazole skeleton, or a metallic complex including benzothiazole skeleton is used as the organic compound with the emitting property.

17. A film formation method comprising the steps of:
vapor-depositing a first plural kinds of organic compounds simultaneously and successively changing a concentration of each of the first plural kinds of organic compounds to form a first organic compound film in a first film formation chamber which includes a plurality of evaporation sources;
vapor-depositing a second plural kinds of organic compounds simultaneously and successively changing a concentration of each of the second plural kinds of organic compounds to form a second organic compound film in a second film formation chamber which includes a plurality of evaporation sources; and
vapor-depositing a third plural kinds of organic compounds simultaneously and successively changing a concentration of each of the third plural kinds of organic compounds to form a third organic compound film in a third film formation chamber which includes a plurality of evaporation sources,
wherein the first organic compound film, the second organic compound film, and the third organic compound film exhibit light emission of different colors, and
wherein a surface of an inner wall of each of the first film formation chamber, the second film formation chamber, and the third film formation chamber is electrolytic-polished.

18. A film formation method according to claim 17, wherein an average surface roughness of the surface of the inner wall in the first film formation chamber, the second film formation chamber, and the third film formation chamber is 5 nm or less.

19. A film formation method according claim 17,
wherein the first plural kinds of organic compounds includes at least a first organic compound and a second organic compound, and
wherein, in the first film formation chamber, a first functional region comprising the first organic compound is formed and a second functional region comprising the second organic compound is formed.

20. A film formation method according to claim 19, wherein a mixed region comprising the first organic compound and the second organic compound is formed in an interface between the first functional region and the second functional region.

21. A film formation method according to of claim 19, wherein the first functional region comprises an organic compound with a hole transport property, and the second functional region comprises an organic compound with an electron transport property.

22. A film formation method according to claim 19, wherein a second mixed region comprising the second organic compound and a third organic compound is formed in a part of the second functional region.

23. A film formation method according to claim 22, wherein the third organic compound is an organic compound with a light emitting property, and the first, second, and third organic compounds are formed of different organic compounds.

24. A film formation method according to claim 19, wherein each of the first organic compound and the second organic compound is an organic compound comprising one of a hole injection property, a hole transport property, an emitting property, a blocking property, an electron transport property, and an electron injection property, and the first and second organic compounds are formed of different organic compounds.

25. A film formation method according to claim 24, wherein an aromatic diamine compound is used as the organic compound with the hole transport property.

26. A film formation method according to claim 24, wherein one of a metallic complex including quinoline skeleton, a metallic complex including benzoquinoline skeleton, an oxadiazole derivative, a triazole derivative, and a phenanthroline derivative is used as the organic compound with the electron transport property.

27. A film formation method according to claim 24, wherein a metallic complex including quinoline skeleton, a metallic complex including benzoxazole skeleton, or a metallic complex including benzothiazole skeleton is used as the organic compound with the emitting property.

28. A film formation method comprising the steps of:
vapor-depositing a first plural kinds of organic compounds simultaneously and successively changing a concentration of each of the first plural kinds of organic compounds to form a first organic compound film over a substrate in a first film formation unit which includes a plurality of evaporation sources;

vapor-depositing a second plural kinds of organic compounds simultaneously and successively changing a concentration of each of the second plural kinds of organic compounds to form a second organic compound film over the substrate in a second film formation unit which includes a plurality of evaporation sources; and vapor-depositing a third plural kinds of organic compounds simultaneously and successively changing a concentration of each of the third plural kinds of organic compounds to form a third organic compound film over the substrate in a third film formation unit which includes a plurality of evaporation sources, wherein the first organic compound film, the second organic compound film, and the third organic compound film exhibit light emission of different colors.

29. A film formation method according to claim 28, wherein the substrate is transferred with a holder to the second film formation unit from the first film formation unit through a first alignment unit after forming the first organic compound film and before forming the second organic compound film.

30. A film formation method according to claim 29, wherein the substrate is transferred with the holder to the third film formation unit from the second film formation unit through a second alignment unit after forming the second organic compound film and before forming the third organic compound film.

* * * * *

UNITED STATES PATENT AND TRADEMARK OFFICE
CERTIFICATE OF CORRECTION

PATENT NO. : 7,629,025 B2  
APPLICATION NO. : 10/769907  
DATED : December 8, 2009  
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1495 days.

Signed and Sealed this

Twenty-first Day of December, 2010

David J. Kappos
*Director of the United States Patent and Trademark Office*